US009349954B2

(12) United States Patent (10) Patent No.: US 9,349,954 B2
D'Andrade et al. (45) Date of Patent: May 24, 2016

(54) STABLE BLUE PHOSPHORESCENT ORGANIC LIGHT EMITTING DEVICES

(71) Applicant: Universal Display Corporation, Ewing, NJ (US)

(72) Inventors: Brian D'Andrade, Westampton, NJ (US); Peter B. Mackenzie, Kingsport, TN (US); Michael S. Weaver, Princeton, NJ (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 302 days.

(21) Appl. No.: 14/023,345

(22) Filed: Sep. 10, 2013

(65) Prior Publication Data

US 2014/0073076 A1 Mar. 13, 2014

Related U.S. Application Data

(62) Division of application No. 12/265,375, filed on Nov. 5, 2008, now Pat. No. 8,557,399.

(60) Provisional application No. 60/986,711, filed on Nov. 9, 2007.

(51) Int. Cl.
*H01L 51/00* (2006.01)
*H01L 51/50* (2006.01)

(52) U.S. Cl.
CPC ........ *H01L 51/0002* (2013.01); *H01L 51/0025* (2013.01); *H01L 51/0085* (2013.01); *H01L 51/0071* (2013.01); *H01L 51/0072* (2013.01); *H01L 51/5016* (2013.01); *H01L 51/5096* (2013.01); *H01L 2251/552* (2013.01)

(58) Field of Classification Search
None
See application file for complete search history.

(56) References Cited

U.S. PATENT DOCUMENTS

| 4,769,292 | A | 9/1988 | Tang et al. |
| 5,247,190 | A | 9/1993 | Friend et al. |
| 5,703,436 | A | 12/1997 | Forrest et al. |

(Continued)

FOREIGN PATENT DOCUMENTS

| CN | 1405904 | 3/2003 |
| EP | 1154676 | 11/2001 |

(Continued)

OTHER PUBLICATIONS

Baldo et al, "Highly efficient phosphorescent emission from organic electroluminescent devices", 1998, Letters to Nature, p. 151-154.*

(Continued)

*Primary Examiner* — Nathan T Leong
(74) *Attorney, Agent, or Firm* — Morris & Kamlay LLP

(57) ABSTRACT

Novel combination of materials and device architectures for organic light emitting devices are provided. In some aspects, specific charge carriers and solid state considerations are features that may result in a device having an unexpectedly long lifetime. In some aspects, emitter purity is a feature that may result in devices having unexpectedly long lifetime. In some aspects, structural and optical considerations are features that may result in a device having an unexpectedly long lifetime. In some aspects, an emissive layer including an organic phosphorescent emissive dopant and an organic carbazole host material results in devices having an unexpectedly long lifetime.

7 Claims, 21 Drawing Sheets

(56) References Cited

U.S. PATENT DOCUMENTS

| | | | |
|---|---|---|---|
| 5,707,745 A | 1/1998 | Forrest et al. | |
| 5,834,893 A | 11/1998 | Bulovic et al. | |
| 5,844,363 A | 12/1998 | Gu et al. | |
| 5,925,980 A | 7/1999 | So et al. | |
| 5,932,895 A | 8/1999 | Shen et al. | |
| 5,949,187 A | 9/1999 | Xu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,133,692 A | 10/2000 | Xu et al. | |
| 6,194,089 B1 | 2/2001 | Choong et al. | |
| 6,294,398 B1 | 9/2001 | Kim et al. | |
| 6,303,238 B1 | 10/2001 | Thompson et al. | |
| 6,326,224 B1 | 12/2001 | Xu et al. | |
| 6,337,102 B1 | 1/2002 | Forrest et al. | |
| 6,468,819 B1 | 10/2002 | Kim et al. | |
| 6,573,651 B2 | 6/2003 | Adachi et al. | |
| 7,179,543 B2 | 2/2007 | Forrest et al. | |
| 7,279,704 B2 | 10/2007 | Walters et al. | |
| 7,431,968 B1 | 10/2008 | Shtein et al. | |
| 7,968,146 B2 | 6/2011 | Wanger et al. | |
| 2002/0028329 A1* | 3/2002 | Ise | C09K 11/06 428/336 |
| 2003/0230980 A1 | 12/2003 | Forrest et al. | |
| 2004/0137263 A1 | 7/2004 | Burn et al. | |
| 2004/0174116 A1 | 9/2004 | Lu et al. | |
| 2006/0006792 A1 | 1/2006 | Strip | |
| 2006/0237715 A1 | 10/2006 | Park et al. | |
| 2006/0251923 A1 | 11/2006 | Lin et al. | |
| 2006/0287498 A1 | 12/2006 | Morishita | |
| 2007/0003789 A1 | 1/2007 | Kwong et al. | |
| 2007/0075631 A1 | 4/2007 | Tung et al. | |
| 2007/0190359 A1* | 8/2007 | Knowles | C07F 15/0033 428/690 |
| 2010/0141126 A1* | 6/2010 | Otsu | C09K 11/06 313/504 |
| 2013/0026452 A1 | 1/2013 | Kottas et al. | |
| 2013/0119354 A1 | 5/2013 | Ma et al. | |

FOREIGN PATENT DOCUMENTS

| | | |
|---|---|---|
| EP | 1238981 | 9/2002 |
| EP | 1450419 | 8/2004 |
| EP | 1722603 | 11/2006 |
| JP | 2006278068 A | 10/2006 |
| JP | 2006302814 A | 11/2006 |
| JP | 2007180277 A | 7/2007 |
| JP | 2007214175 | 8/2007 |
| JP | 2007/262135 | 10/2007 |
| JP | 2007254312 A | 10/2007 |
| JP | 2010-135467 | 6/2010 |
| TW | 200540246 A | 12/2005 |
| TW | 200621935 A | 7/2006 |
| TW | 200644718 A | 12/2006 |
| TW | 200721564 A | 6/2007 |
| WO | WO 2004/111066 | 12/2004 |
| WO | 2007044236 A2 | 4/2007 |
| WO | WO 2007/095118 | 8/2007 |
| WO | WO 2008/044723 | 4/2008 |
| WO | WO 2008/057394 | 5/2008 |
| WO | WO 2008/156879 | 12/2008 |
| WO | WO 2010/011390 | 1/2010 |
| WO | WO 2010/111175 | 9/2010 |

OTHER PUBLICATIONS

Antonio-Tones et al., "Modelling of a Compensation Scheme for OLED Degradation" SID 2004 International Symposium, Seattle, Washington.

Baldo et al., "Transient Analysis of Organic Electrophosphorescence. II. Transient Analysis of Triplet-Triplet Annihilation", Physical Review B, V. 62, No. 16, 2000, pp. 10967-10977.

Bera R. N. et al. "Highly Branched Phosphorescent Dendrimers for Efficient Solution-Processed Organic Light-Emitting Diodes", Advanced Functional Materials, Wiley VCH, Weinheim, DE, No. 17, May 2007, pp. 1149-1152.

Bernard Geffroy et al., "Organic light-emitting diode (OLED) technology: materials, devices and display technologies", Polym Int 55:572-582 (2006).

Bettington et al. "Tris-Cyclometalated Iridium (III) Complexes of Carbazole(fluorenyl)pyridine Ligands: Synthesis, Redox and Photophysical Properties, and Electrophosphorescent Light-Emitting Diodes", Chem. Eur. J. 2006, 00, 0-0; full paper.

Chang et al., "Graded Doping Profiles for Reduction of Carrier Trapping in Organic Light-Emitting Devices Incorporating Doped Polymers", Appl. Phys. Lett. vol. 78, No. 5, 2001, pp. 574-576.

Clymer et al. "Characterization of thin-metal anode buffers in organic devices" Microwave and Optical Technology Letters, vol. 48, No. 10, Oct. 2006, pp. 2070-2072.

Denis Y. Kondakov et al. "Variable sensitivity of organic light-emitting diodes to operation-induced chemical degradation: Nature of the antagonistic relationship between lifetime and efficiency", Journal of Applied Physics 108,074513 (2010).

Freeman et al., "Color II, and CFA Interpolation", MIT EECS 6.098/6.882, 2006.

Giebink et al., "Intrinsic Luminance loss in Phosphorescent Small-Molecule Organic Light Emitting Devices Due to Bimolecular Annihilation Reactions", Journal of Applied Physics, vol. 103, Issue 4, pp. 044509-044509-9 (2008).

Hobson P. A. et al., "Surface plasmon mediated emission from organic light-emitting diodes" Advanced Materials, Wiley VCH, Weinheim, Germany, vol. 14, No. 19, Oct. 2002, pp. 1393-1396.

Holmes et al., "Efficient, Deep-Blue Organic Electrophosphorescence by Guest Charge Trapping", Applied Physics Letters, V. 83, No. 18, 2003, pp. 3818-3820.

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hyoung-Yun Oh et al., "Efficient blue organic light-emitting diodes using newly-developed pryene-based electron transport materials", Organic Electronics 10 (2009) 163-169.

International Search Report and Written Opinion corresponding to the PCT/US2008/082647 application dated Jul. 6, 2009.

International Search Report and Written Opinion corresponding to the PCT/US2008/082328 application dated Mar. 10, 2009.

International Search Report/Written Opinion corresponding to PCT/US2008/082640 application dated Jun. 5, 2009.

Kiy et al., "Observation of the Mott-Gurney Law in Tris(8-hydroxyquinoline) Aluminum Films", Appl. Phys. Lett. vol. 80, No. 7, 2002, pp. 1198-1200.

Kondakov et al., "Distinguished Paper: Structural Identification of Chemical Products and Mechanism of Operational Degradation of OLEDs", SID 07 Digest, pp. 1494-1496.

Kondakov et al., "Free-radical Pathways in Operational Degradation of OLEDs", Journal of SID 16/1, 2008, pp. 37-44.

Kozlov et al., "Optical Properties of Molecular Organic Semiconductor Thin Films Under Intense Electrical Excitation", Applied Physics Letters, v. 74, No. 8, 1999, pp. 1057-1059.

Lin Ke; Burden et al., "Au-ITO Anode for efficient polymer light-emitting device operation" IEEE Photonics Technology Letters, vol. 17, No. 3, Mar. 2005, pp. 543-545.

Lo et al., "Blue Phosphorescence from Iridium(III) Complexes at Room Temperature", Chem. Mater. 2006, 18, pp. 5119-5129.

Low et al., "Photo and Photo-Oxidative Degradations of Poly(phenylene vinylene) Derivatives", Thin Solid Films 413, 2002, 160-166.

Meyer et al. "Highly Efficient Simplified Organic Light Emitting Diodes", Appl. Phys. Lett. vol. 91, 2007, p. 113506.

Moon Jong-Min et al. "Enhancement of hole injection using ozone treated Ag nanodots dispersed on indium tin oxide anode for organic light emitting diodes" Applied Physics Letters, AIP, American Institute of Physics, NY, vol. 90, No. 16, Apr. 20, 2007, pp. 163516-1-163516-3, XP012094284.

Office Communication in Chinese Application No. 200880122446.4 dated Nov. 16, 2012.

(56) References Cited

OTHER PUBLICATIONS

Pardo et al., "In Situ Purification of Organic Materials for Organic Light-Emitting Device Fabrication", Japanese Journal of Applied Physics, Part 1, V. 40, No. 8, 2001, pp. 4922-4923.

Peng et al. "Efficiency improvement of phosphorescent organic light-emitting diodes using semitransparent Ag as anode" Applied Physics Letters, vol. 88, No. 3, 2006. pp. 1-3; 033509.

Peng et al., "Efficient organic light-emitting diode using semitransparent silver as anode" Applied Physics Letters 87, 173505, p. 1-3 (2005).

Popovic et al., "Reliability of Degradation of Small Molecule-Based Organic Light-Emitting Devices (OLEDs)", IEEE Journal of Selected Topics in Quantum Electronics, vol. 8, No. 2, 2002, pp. 362-371.

Reineke et al., "Triple-Exciton Quenching in Organic Phosphorescent Light-Emitting Diodes with Ir-based Emitters", Physical Review B 75, 2007, pp. 125328.

Salvatore Cina, "Recent Development in Organic Light Emitting Diodes (OLEDs)", CDT, Greenwich House, pp. 1-27, Spring 2002 Meeting of the SID Mid-Europe Chapter, Rome, Italy Mar. 21-22, 2002.

Stephan Winter et al., "Photoluminescence degradation of blue OLED emitters" Proc. SPIE 6999, Organic Optoelectronics and Photonics III, 69992N (Apr. 16, 2008).

Sun et al. "Management of singlet and Triplet Excitons for Efficient White Organic Light-Emitting Devices", Nature 20060413 GB, vol. 440, No. 7086, pp. 908-912.

Tutis et al., "The Mechanism of Lifetime Extension Due to CuPc Injection Layer in Organic Light Emitting Diodes", Proc. of SPIE vol. 5464, pp. 330-336.

Varatharajan Sivasubramaniam et al., "Fluorine cleavage of the light blue heteroleptic triplet emitter FIrpic", Journal of Fluorine Chemistry 130 (2009) 640-649.

Wong, Wai-Yeung, "Multifunctional Iridium Complexes Based on Carbazole Modules as Highly Efficient Electrophosphors," Angew. Chem. Int. Ed., 45:7800-7803 (2006).

Yates et al., "Surface Plasmon-Polariton Mediated Emission from Phosphorescent Dendrimer Light-Emitting Diodes", Applied Physics Letters, v. 88, 2006, pp. 161105.

Baldo et al., "Highly Efficient Phosphorescent Emission from Organic Electroluminescent Devices," Nature, vol. 395, 151-154, (1998).

Baldo et al., "Very high-efficiency green organic light-emitting devices based on electrophosphorescence," Appl. Phys. Lett., vol. 75, No. 1, 4-6 (1999).

Office Action and Search Report in TOC (Taiwan) Patent Application No. 09714330 mailed Aug. 1, 2014, with English language translation.

Korean Office Action with English language translation for Korean Application No. 10-2010-7012725, mailed Apr. 7, 2014.

* cited by examiner

STABLE BLUE PHOSPHORESCENT ORGANIC LIGHT EMITTING DEVICES

This application claims priority to U.S. Provisional Application Ser. No. 60/986,711, filed Nov. 9, 2007, the disclosure of which is herein expressly incorporated by reference.

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

BACKGROUND

1. Field of the Invention

The invention relates generally relates to organic light emitting devices (OLEDs). More specifically, the invention is directed to novel combination of materials and device architectures that result in exceptionally long-lived blue devices.

2. Related Art

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using 1931 CIE coordinates, which are well known to the art.

One example of a green emissive molecule is tris(2-phenylpyridine) iridium, denoted Ir(ppy)$_3$, which has the structure of Formula I:

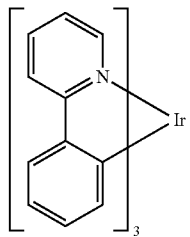

In this, and later figures herein, the dative bond from nitrogen to metal (here, Ir) as a straight line is depicted.

The limited operational stability of organic light emitting devices (OLEDs), however, presents a challenge to their wide-spread acceptance for use in large-area displays and solid-state lighting. While improved packaging techniques and material purity have lead to significant progress in eliminating extrinsic sources of degradation, the remaining intrinsic luminance loss and voltage rise accompanying long term device operation are not yet well understood.

Various hypotheses have been offered to explain the basis for intrinsic degradation in device efficiency, with the most widely accepted advocating chemical degradation of a fraction of the emissive constituent molecules. Presumably, bond cleavage produces radical fragments, which then participate in further radical addition reactions to form even more degradation products. These products act as non-radiative recombination centers, luminescence quenchers, and deep charge traps. For example, several studies have shown that both anions and cations of tris(8-hydroxyquinoline)aluminum (Alq$_3$) are unstable, and evidence has recently been presented that the excited states themselves may form reaction centers in the case of the common host material 4,4'-bis(9-carbazolyl)-2,2'-biphenyl (CBP).

SUMMARY OF THE INVENTION

The invention provides an organic light emitting device that may provide numerous advantages over devices currently in use. The organic light emitting device including an anode, a cathode, and an emissive layer disposed between the anode and the cathode. The invention may be implemented in a number of ways.

In one aspect, charge carriers and solid state considerations are features that may result in a device having a longer lifetime. A device may have an emissive layer that includes a host having a triplet energy and a phosphorescent emissive dopant having a peak emissive wavelength less than 500 nm. The device also includes an exciton blocking layer at least 5 nm thick disposed between the emissive layer and the cathode and adjacent to the emissive layer, the exciton blocking layer consisting essentially of materials having a triplet energy greater than or equal to the triplet energy of the host of the emissive layer. The emissive layer is at least 40 nm thick. Electrons in the emissive layer are carried predominantly by the host. The HOMO of the phosphorescent emissive dopant is at least 0.5 eV higher than the HOMO of the host. The concentration of the phosphorescent emissive dopant in the emissive layer is at least 9 wt %. The phosphorescent emissive dopant comprises a cyclometallated N,C-donor imidazophenanthridine ligand comprising at least one 2,2,2-trialklethyl substituent. It is believed that this combination of features leads to a device having an unexpectedly long lifetime.

In one aspect, emitter purity is a feature that may result in devices having longer lifetime. In particular, a device that includes, inter alia, an emissive layer including a host and a phosphorescent emissive dopant having a peak emissive wavelength less than 500 nm and where (i) the phosphorescent emissive dopant is deposited from a source that has a purity in excess of about 99.5% as determined by high pressure liquid chromatography, (ii) the source further having a combined concentration of halide and metal impurities below about 100 ppm, (iii) the phosphorescent emissive dopant leaves a residue corresponding to less than about 5 wt % of the original charge in the sublimation crucible, and (iv) the phosphorescent emissive dopant has a sublimation temperature less than about 350° C. and is deposited via sublimation may have a surprisingly long lifetime. The phosphorescent emissive dopant may be deposited in an environment having less than 10 ppm oxygen and in the near absence of light.

In one aspect, charge carriers and solid state considerations are features that may result in a device having a longer lifetime. In particular, a device including an emissive layer disposed between the anode and the cathode, such that the emissive layer includes a host and a phosphorescent emissive dopant having a peak emissive wavelength less than about 500 nm and such that when a voltage is applied across the device, electrons in the emissive layer are carried predominantly by the host and where the (i) HOMO of the phosphorescent dopant is at least about 0.5 eV higher than the HOMO of the host and (ii) the phosphorescent emissive dopant has a concentration of at least about 9 wt % in the emissive layer may have a surprisingly longer lifetime.

In one aspect, structural and optical considerations are features that may result in a device having a longer lifetime. For example, a device including a CuPc hole injection layer disposed between the anode and the cathode and adjacent to the anode, an emissive layer disposed between the anode and the cathode such that the emissive layer includes a host and a phosphorescent emissive dopant having a peak emissive wavelength less than about 500 nm, and an exciton blocking at least about 5 nm thick disposed between the emissive layer and the cathode and adjacent to the emissive layer such that the exciton blocking layer consisting essentially of materials having a triplet energy greater than or equal to the host of the emissive layer and where (i) the emissive layer is at least about 40 nm thick, and (ii) the emissive layer is at least about 40 nm from the cathode may have a surprisingly longer lifetime.

In one aspect, the device may include a CuPc hole injection layer disposed between the anode and the cathode and adjacent to the anode, an emissive layer disposed between the anode and the cathode such that that the emissive layer includes a host and a phosphorescent emissive dopant having a peak emissive wavelength less than about 500 nm, and an exciton blocking layer at least about 5 nm thick disposed between the emissive layer and the cathode and adjacent to the emissive layer such that the exciton blocking layer consists essentially of materials having a triplet energy greater than or equal to the triplet energy of the host of the emissive layer and where (i) the emissive layer is at least 40 nm thick; and (ii) the surface plasmon mode is less than about 30% may have a longer lifetime.

In one aspect, a device is provided having an anode, a cathode, and an emissive layer disposed between the anode and the cathode. The emissive layer includes an organic phosphorescent emissive dopant, and an organic carbazole host material.

Preferably, an ultra high vacuum system may be used in addition to the particular combinations of device lifetime-enhancing features, as disclosed herein. In particular, depositing organic materials (e.g., phosphorescent emissive dopant) in an ultra high vacuum system having a pressure level less than about $1 \times 10^{-8}$ Torr, preferably in the range of about $1 \times 10^{-8}$ Torr to about $1 \times 10^{-12}$ Torr, more preferably in the range of about $1 \times 10^{-9}$ Torr to about $1 \times 10^{-12}$ Torr, or most preferably in the range of about $1 \times 10^{-10}$ Torr to about $1 \times 10^{-2}$ Torr may be used in addition to the particular combinations of features disclosed herein to improve device lifetime.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

The accompanying drawings, which are included to provide a further understanding of the invention, are incorporated in and constitute a part of this specification; illustrate embodiments of the invention and together with the detailed description serve to explain the principles of the invention. No attempt is made to show structural details of the invention in more detail than may be necessary for a fundamental understanding of the invention and various ways in which it may be practiced.

FIG. 13A shows the J-V characteristics of the devices studied. Inset: schematic of the device structure, with the dimensions, $x_1$-$x_3$ of FIG. 12, indicated as shown. FIG. 13B shows the external quantum efficiency (left scale) and emission spectrum (right scale) obtained at J=10 mA/cm².

FIG. 14A shows the luminance degradation versus time for initial brightnesses of $L_0$=1000, 2000, 3000, and 4000 cd/m² as indicated by the arrow. Solid black lines indicate a fit using the exciton localization degradation model discussed in the text. Note that the recombination zone width, $d_{rec}$, is variable in these fits. The data are reproduced for comparison with the exciton-exciton degradation model in FIG. 14B and with the exciton-polaron model in FIG. 14C. All fitting parameters are given in Table 1.

FIG. 15A shows the voltage rise for each of the four devices studied. The black lines are calculated using the exciton localization model. The data are reproduced in FIG. 15B and FIG. 15C for comparison with fits from the exciton-exciton and exciton-polaron models respectively. All fitting parameters are given in Table 1.

FIG. 16A shows the photoluminescence transients obtained for an as-grown device, one aged to L(t')=0.59 $L_o$($L_0$=1000 cd/m²), and another aged to L(t')=0.16 $L_o$ of its initial $L_0$=3000 cd/m² brightness. Solid black lines are fits from the exciton localization model. Predictions of the exciton-exciton annihilation model are shown in FIG. 16B and those for the exciton-polaron annihilation model in FIG. 16C. Fitting parameters are given in Table 1.

In FIG. 17A, a direct or pre-dissociative potential, R, crosses the singlet or triplet first excited state energy surface. FIG. 17B shows the exciton-exciton annihilation process, which leads to a ground ($S_0$) and upper excited state ($S_n^*$ or $T_n^*$) according to the reaction $S_1(T_1)+S_1(T_1) \rightarrow S_0+S_n^*(T_n^*)$. Direct or pre-dissociation may occur from the upper excited state (gray arrow, route 1), or it may relax vibronically and undergo hot-molecule dissociation (gray arrow, route 2) as discussed in the specification. FIG. 17C shows the exciton-polaron mechanism, in which energy transfer from the exciton results in an excited polaron that dissociates along the analogous direct/pre-dissociative and hot-molecule routes. Dotted lines indicate vibrational energy levels within each anharmonic electronic manifold.

FIG. 18A shows the average defect density, $Q_{AVG}$(t') and FIG. 18B shows the average defect formation rate, $F_X$(t'), per exciton, per hour, as defined in the text. The curves are calculated using the exciton-polaron model, at initial luminances of $L_0$=1000, 2000, 3000, and 4000 cd/m² as indicated by the arrow.

FIG. 19A shows the predicted lifetime improvement at $L_0$=1000 cd/m², obtained by increasing the recombination zone width, $d_{rec}$. FIG. 19B shows the increase in lifetime calculated for a reduction in degradation coefficient, $K_X$. Both FIGS. 19A and 1911 assume the exciton-polaron model; the filled circles indicate where the devices of this study lie on the curves.

DETAILED DESCRIPTION

Definitions

Figure 1:
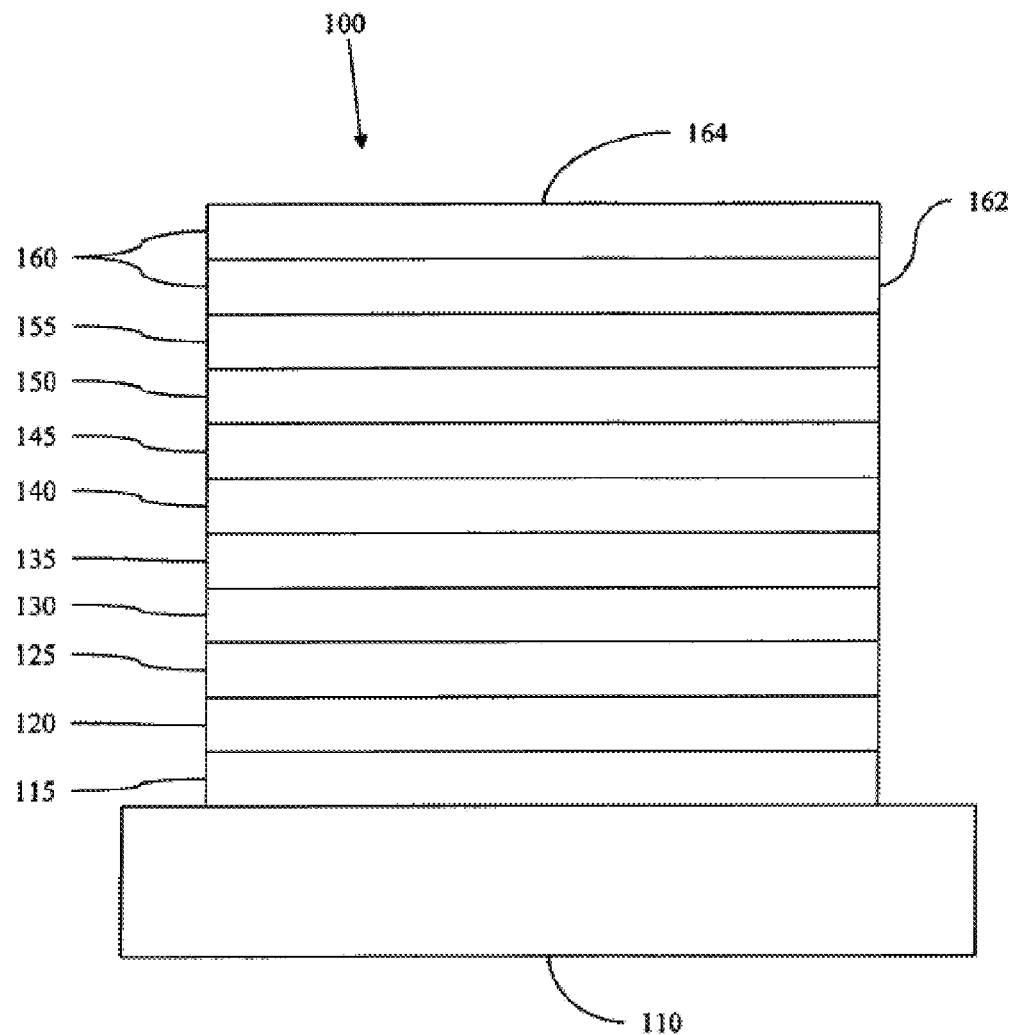
FIG. 1 shows an organic light emitting device having separate electron transport, hole transport, and emissive layers, as well as other layers.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand is referred to as "photoactive" when it is believed that the ligand contributes to the photoactive properties of an emissive material.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

More details on OLEDs, and the definitions described above, can be found in U.S. Pat. No. 7,279,704, which is incorporated herein by reference in its entirety.

Generally, an OLED may include at least one organic layer disposed between and electrically connected to an anode and a cathode. When a current is applied, the anode may inject holes and the cathode injects electrons into the organic layer(s). The injected holes and electrons each migrate toward the oppositely charged electrode. When an electron and hole localize on the same molecule, an "exciton," which is a localized electron-hole pair having an excited energy state, may be formed. Light may be emitted when the exciton relaxes via a photoemissive mechanism. In some cases, the exciton may be localized on an excimer or an exciplex. Non-radiative mechanisms, such as thermal relaxation, may also occur, but are generally considered undesirable.

Initially, OLEDs employed emissive molecules that emitted light from their singlet states ("fluorescence"). See, e.g., U.S. Pat. No. 4,769,292, which is incorporated by reference in its entirety. Fluorescent emission generally occurs in a time frame of less than about 10 nanoseconds. More recently, however, OLEDs having emissive materials that emit light from triplet states ("phosphorescence") have been demonstrated. See Baldo ET AL., "Highly Efficient Phosphorescent Emission from Organic Electroluminescent Devices," NATURE, vol. 395, 151-154, 1998; ("Baldo-I") and Baldo ET AL., "Very high-efficiency green organic light-emitting devices based on electrophosphorescence," APPL. PHYS. LETT., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

FIG. 1, which illustrates an embodiment, is a schematic showing an organic light emitting device 100. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 may be a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference. The terms "anode" and "cathode" are intended to be used in their broadest sense, to include any layer that injects charge into an OLED. For example, an organic charge generation layer in a stacked OLED that injects electrons is considered a "cathode."

More examples for each of these layers are available. For example, a flexible and transparent substrate-anode combination is disclosed in U.S. Pat. No. 5,844,363, which is incorporated by reference in its entirety. An example of a p-doped hole transport layer is nm-MTDATA doped with $F_4TCNQ$ at a molar ratio of about 50:1, as disclosed in U.S. Patent Application Publication No. 2003/0230980, which is incorporated by reference in its entirety. Examples of emissive and host materials are disclosed in U.S. Pat. No. 6,303,238, which is incorporated by reference in its entirety. An example of an n-doped electron transport layer is BPhen doped with Li at a molar ratio of about 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
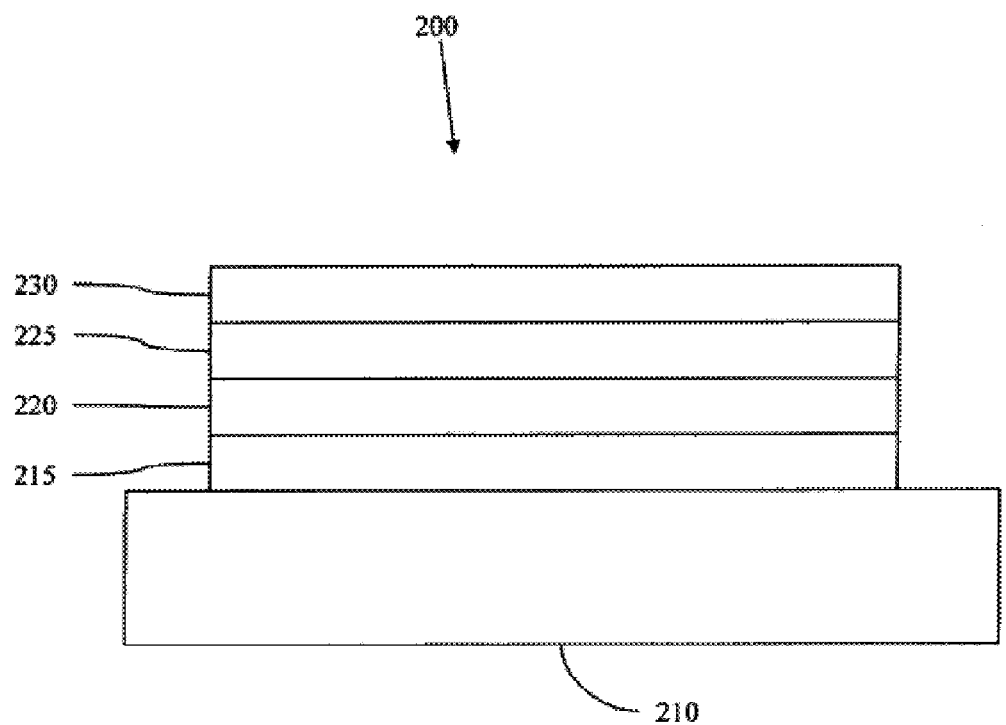
FIG. 2 shows an inverted organic light emitting device that does not have a separate electron transport layer.

FIG. 2, which illustrates another embodiment, shows an inverted OLED 200. The device may include a substrate 210, a cathode 215, an emissive layer 220, a hole transport layer 225, and an anode 230. Device 200 may be fabricated by depositing the layers described, in order. Since the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Attaining long blue device lifetimes with phosphorescent emitters has been a long-standing problem in OLED device research. Suitable solutions to this problem would be useful for efficient, long-lived display devices as well as new white lighting applications. In order to make a commercially viable fill color OLED display, the industry desires a device which emits "saturated" blue, i.e., light that has 1931 CIE coordinates $x<0.16$, $y<0.20$ and a device lifetime of at least 10,000 hours with an initial luminance of 1000 nits. Notwithstanding many claims to improved lifetime materials and devices, device half-lives greater than about 2000 h starting from an initial luminance of about 500 nits have not been previously reported for phosphorescent blue devices with 1931 CIE color coordinates of $x<0.17$, $y<0.27$. Accordingly, a novel combination of materials and device architectures are provided, resulting in device half-lives greater than about 10,000 h at 1931 CIE coordinates $x<0.16$, 0.26. Some key features of the device, which may be used individually or in various combinations as described herein, may include (i) a thick emissive layer (EML) in direct contact with a hole injection layer (HIL) in direct contact with the anode, and (ii) a semi-transparent metal anode or cathode, as well as high emissive metal complex doping levels, the use of certain families of emitters, including cyclometallated iridium complexes of imidazophenanthridine ligands, optimized HOMO and LUMO energy levels, and specific hole injection, hole transport, host, blocking layer and electron transport materials.

It has been found that a model based on exciton-polaron interaction as a source of degraded molecules and ultimately device failure accurately matches many of the experimental results reported herein. Ways to reduce this exciton-polaron interaction and increase device lifetime are also reported.

According to one embodiment, the long lifetimes of thick EML devices reflect lower rates of degradation-related exciton-polaron reactions, and also lower rates of exciton quenching by the impurities that may be formed. In particular, at a given luminance, the concentration of excitons, polarons and quenchers may be lower in thicker EML devices, thereby making degradative encounters and energy transfers to quenchers less likely and luminance-based lifetimes longer. The term "thick EML," as used herein generally refers to emissive layers with thicknesses greater than about 40 nm, greater than about 50 nm, specifically greater than about 60 nm, even more specifically greater than about 70 nm, or devices wherein the EML thickness is greater than the sum of the recombination zone thickness and about 2 times the average exciton diffusion length. The term "recombination zone thickness," as used herein generally refers to the thickness of that portion of the EML wherein about 95% of the recombination occurs. The EML may have a thickness as great as about 100 nm or thicker. However, thicknesses in excess of greater than 100 nm may have only marginal additional benefits and may undesirably increase fabrication times.

To the extent that excitons reside on the emissive dopant and that quenchers may also be derived from those same dopants, high concentrations of the emissive dopant would be expected to increase the average exciton-quencher distance, thereby reducing the probability of energy transfer, in turn reducing the sensitivity of the device to the accumulation of quenching impurities. Therefore, some embodiments are directed to thick EML devices with doping concentrations greater than about 9%, specifically greater than about 12%, even more specifically greater than about 14% to achieve long blue device lifetimes.

For example, if a blue emitter is incorporated in a device where it transports charge and a significant amount of recombination occurs on the emitter, then the concentration of the emitter in the host material may be greater than about 9 wt. % to enable long lived devices. This emitter concentration may be necessary to reduce the operating voltage by allowing more facile transport of holes, to increase the diffusion length of emitter excitons, to improve the morphological stability of the host material, and to disperse decomposition products over a large volume. The enhancement in lifetime from an initial luminance of about 1,000 cd/m$^2$ is shown in FIG. 3 where the rate of luminance depreciation with time, of the OLED shown in FIG. 3, decreases with increasing emitter concentration.

Emitter materials may be stable to holes as inferred from devices where emitters are used as hole-transport layers or hole-injection layers, and device operating voltage decreases with emitter concentration due to its ability to transport holes. As more emitters are added to a host matrix, a network of emitters may be formed where every emitter has another emitter as one of its nearest neighbors, so the hopping of holes between emitters becomes more efficient hence hole conductivity of the layer improves and there is corresponding reduction in operating voltage. A low operating voltage suggests a reduction in internal heating effects that may be present in OLED layers.

Figure 3:
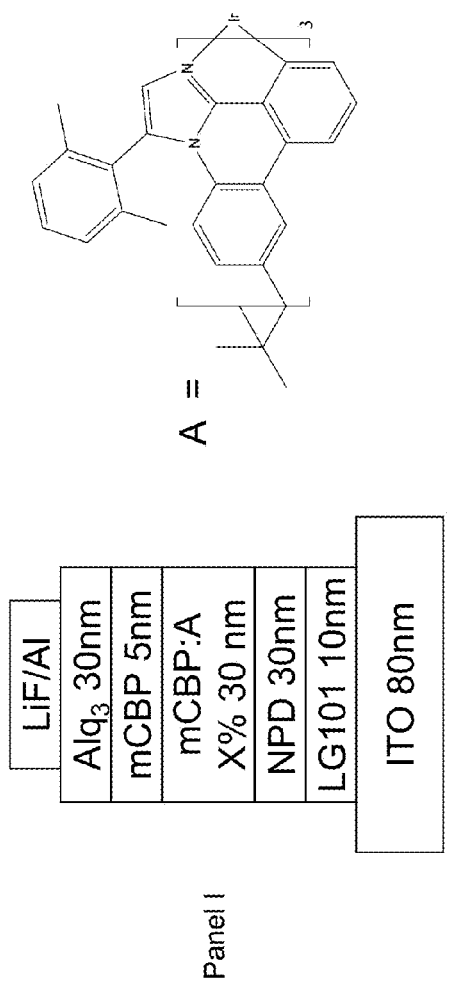
FIG. 3 shows a plot of the normalized luminance versus time and a plot of the current density versus voltage for device in panel I.
Figure 3:
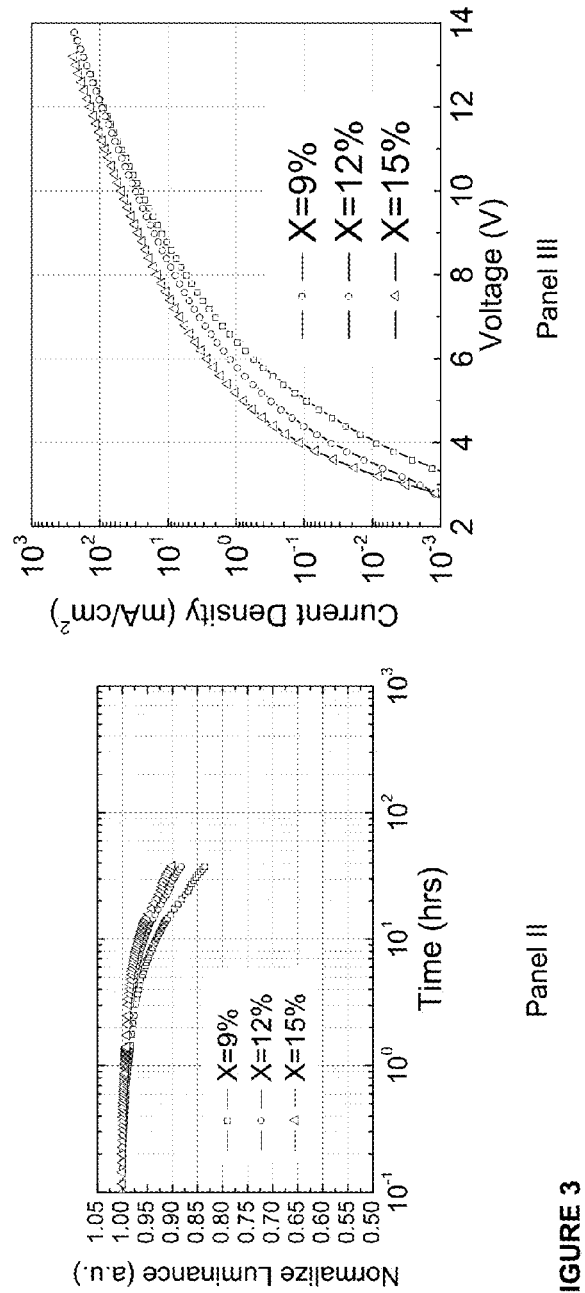

For example, the operating voltage at about 10 mA/cm$^2$ of the device in FIG. 3 was about 7.5 V, about 8.4 V and about 8.8 V for emitter concentrations of about 15 wt. %, about 12 wt. % and about 9 wt. %. There was about a 14.7% reduction in the power dissipated across the device. Specifically, the device should have operating voltages less than about 4 V.

If one emitter has a nearest neighbor that is a second emitter, the efficiency of an exciton localized on an emitter to diffuse to the second emitter is higher than the efficiency of an exciton moving from one emitter, that is surrounded by a host material having a triplet energy greater than the emitter exciton triplet energy (or an energy barrier), to a second emitter. Hence, increasing the emitter concentration may increase the number of emitters that have emitter molecules as their nearest neighbor and it increases the diffusion length of emitter excitons.

Emitters generally have higher morphological (thermal) stability than their hosts. For example, Ir(ppy)$_3$ is known to prevent that crystallization of CBP. The glass transition temperature is a measure of the morphological stability and this temperature may be assumed to be a weighted average of the glass transition temperatures of components of a mixed film. Therefore, increasing the concentration of the emitter in the host may be a way to enhance the morphological stability of films. For example, emitter A in FIG. 3 does not have a glass transition temperature; whereas, mCBP and mCP have glass transition temperatures of about 95° C. and about 65° C., respectively. The melting points of emitter A, mCBP and mCP are about 435° C., about 270° C. and about 180° C., respectively.

Degraded molecules may act as exciton quenchers and their concentration may directly affect device luminance degradation based on the mathematical model of device luminance degradation.

Additionally, the source material used to fabricate an OLED may have a purity that is greater than about 99.5% as determined from high pressure liquid chromatography. This level of purity may be accomplished by performing at least two re-crystallizations and at least two sublimation purifications of the source material. Additionally, the concentration of halide and metal impurities should be less than about 100 ppm.

Impurities may have many adverse effects on device operational lifetime. Halide, ligand or metal impurities may affect the conductivity of the organic layers and this could create unfavorable charge balance characteristics. The impurities may be chemically reactive and may destroy emissive molecules to create non-emissive species, or the impurities may trap charge and act as quenching sites that simultaneously contribute to the increase in the operating voltage of devices.

Figure 4:
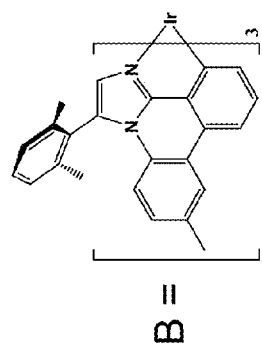
FIG. 4 shows a plot of the luminous efficiency versus luminance and a plot of the EL normalized versus wavelength for the device in Panel I.
Figure 4:
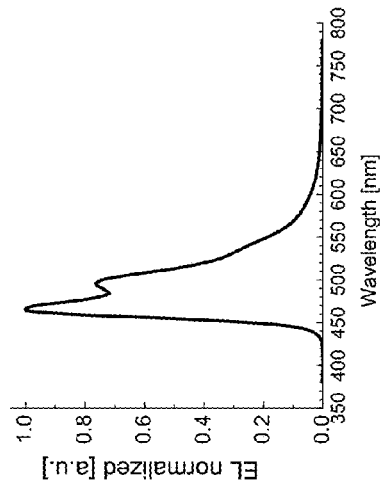
Figure 4:
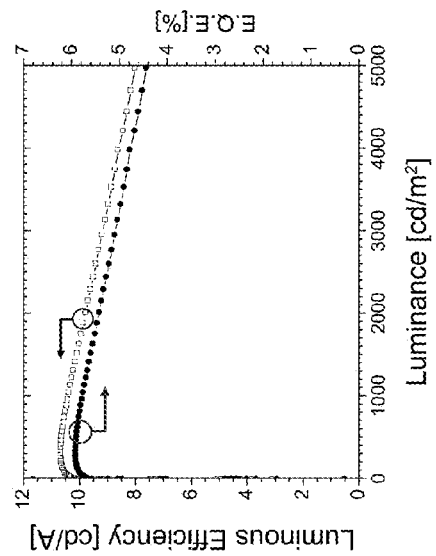
Figure 5:
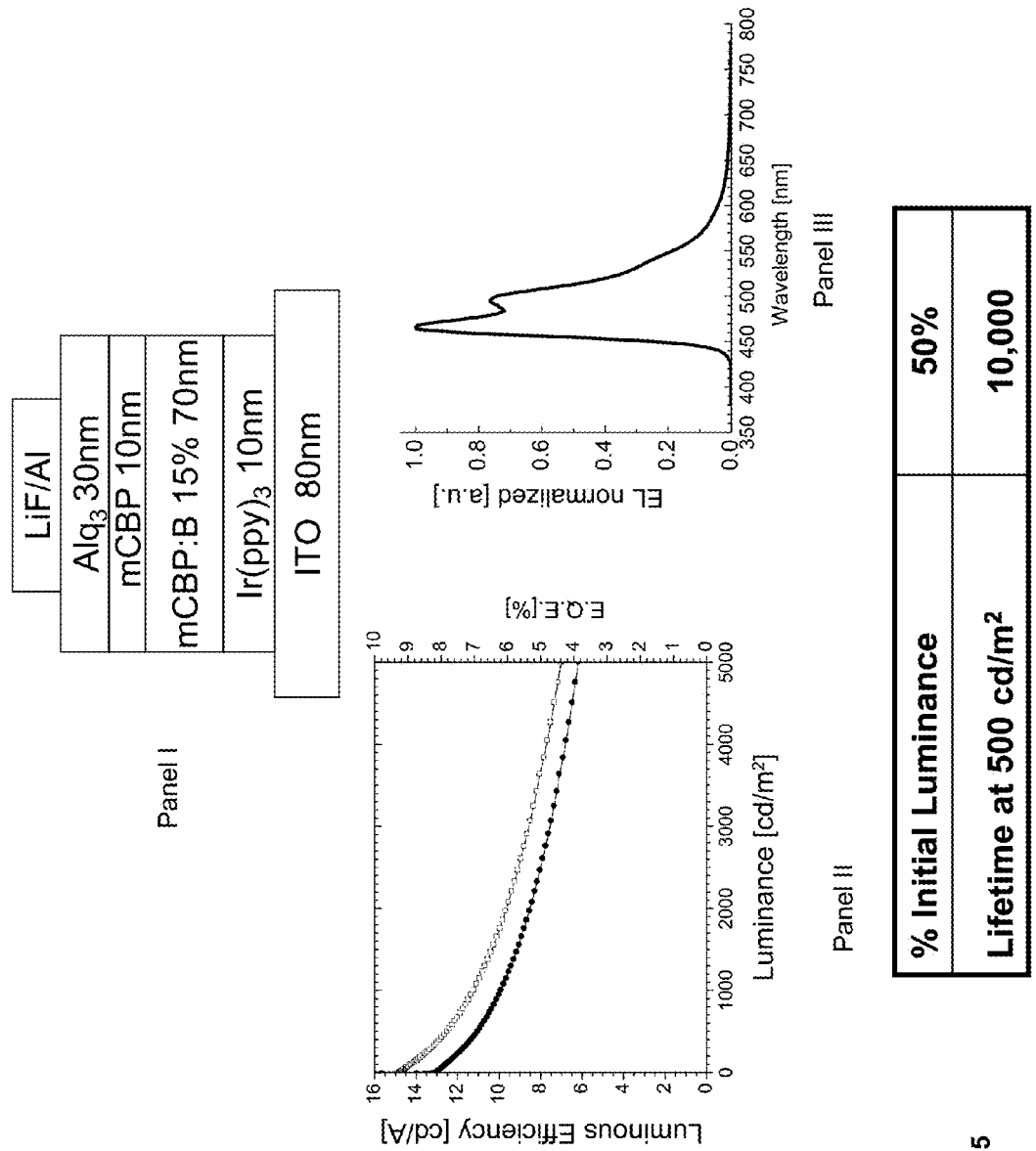
FIG. 5 shows a plot luminous efficiency versus luminance and a plot of the EL normalized versus wavelength for the device in Panel I.

For example, FIG. 4 shows the characteristics of a device with emitter B, which had a purity of less than about 99.5%. FIG. 5 shows the characteristics of a near identical device as in FIG. 4 but with emitter B having about 99.6% purity and halide impurities less than about 17 ppm. The projected device lifetime increased from about 6,000 hrs for a low purity emitter source material to about 10,000 hrs for a high purity emitter source material.

In a further embodiment, optimized HOMO and LUMO levels and selections of HIL, HTL, blocking layer and ETL materials and layer thicknesses may also be important to achieving optimal charge recombination kinetics inside the emissive layer, thereby avoiding excessive concentration of recombination close to the interface of the EML with the other layers. In particular, diffuse charge recombination zones may be employed to reduce the probability of exciton-polaron reactions and increasing the average exciton-quencher separation. One way of promoting diffuse recombination and minimizing the likelihood of recombination close to an interface may be to use grading doping deposition techniques, so that there are no sharp interfaces in the device and the dopant concentration within the host is gradually changed. The interfaces in OLED devices may tend to give rise to charge accumulations at the interfaces due to charge injection barriers that inevitably arise when the charge transport medium changes, and that when such charge accumulations are within diffusion distance of the diffusing excitons, exciton-polaron reactions occur and give rise to quenching impurities. Accordingly, graded doping techniques may be useful in obtaining long device lifetimes in thick EML blue devices.

The location of the emission region within a device may determine many aspects of device performance characteristics including its emission chromaticity, efficiency, efficacy, and operational lifetime. For blue OLED longevity, the emission region may be positioned such that power dissipation in surface plasmon modes (at the metallic cathode) should be minimized. The dissipation of surface plasmon mode energy is essentially heat that can contribute to cathode degradation.

Figure 6:
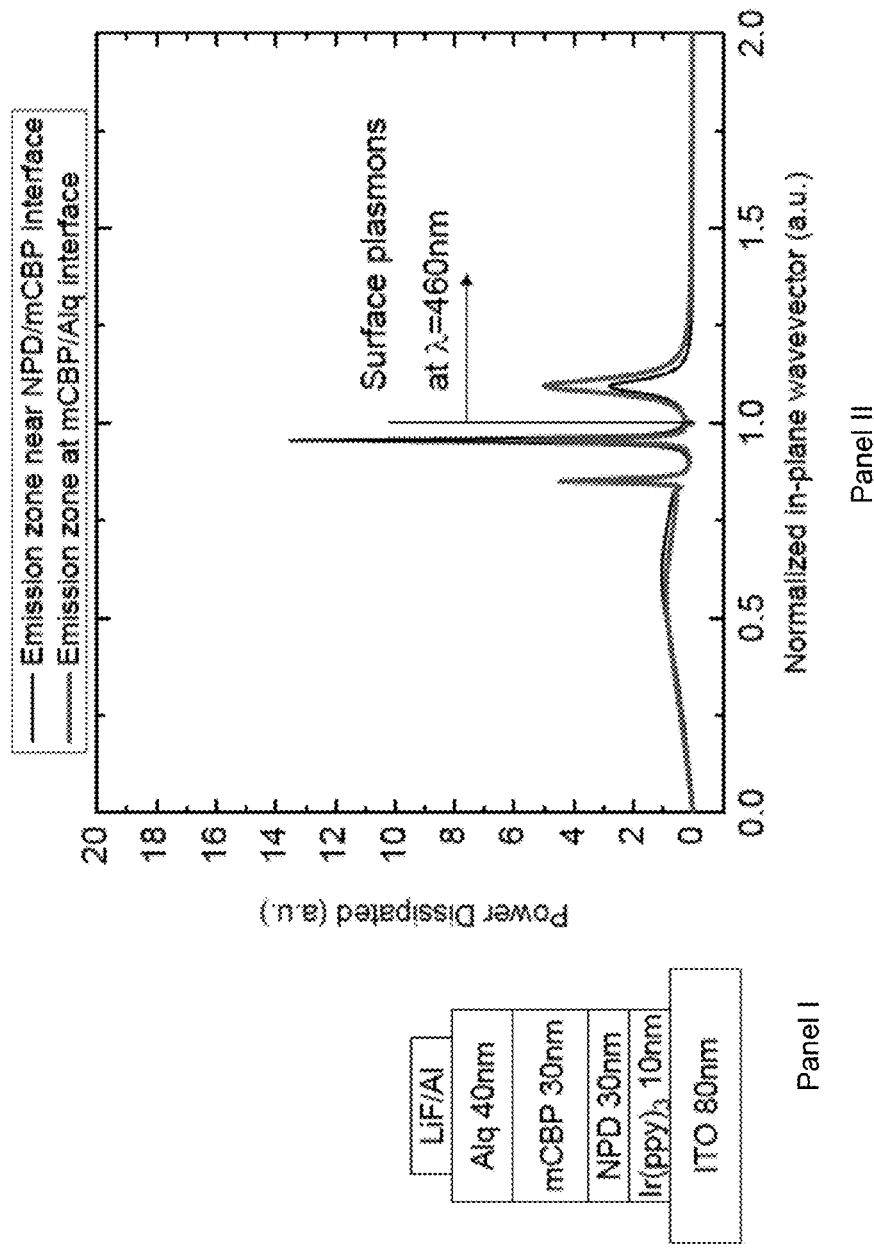
FIG. 6 shows a plot of the percentage power dissipated versus normalized in-plane wavevector for the device in Panel I.
Figure 7:
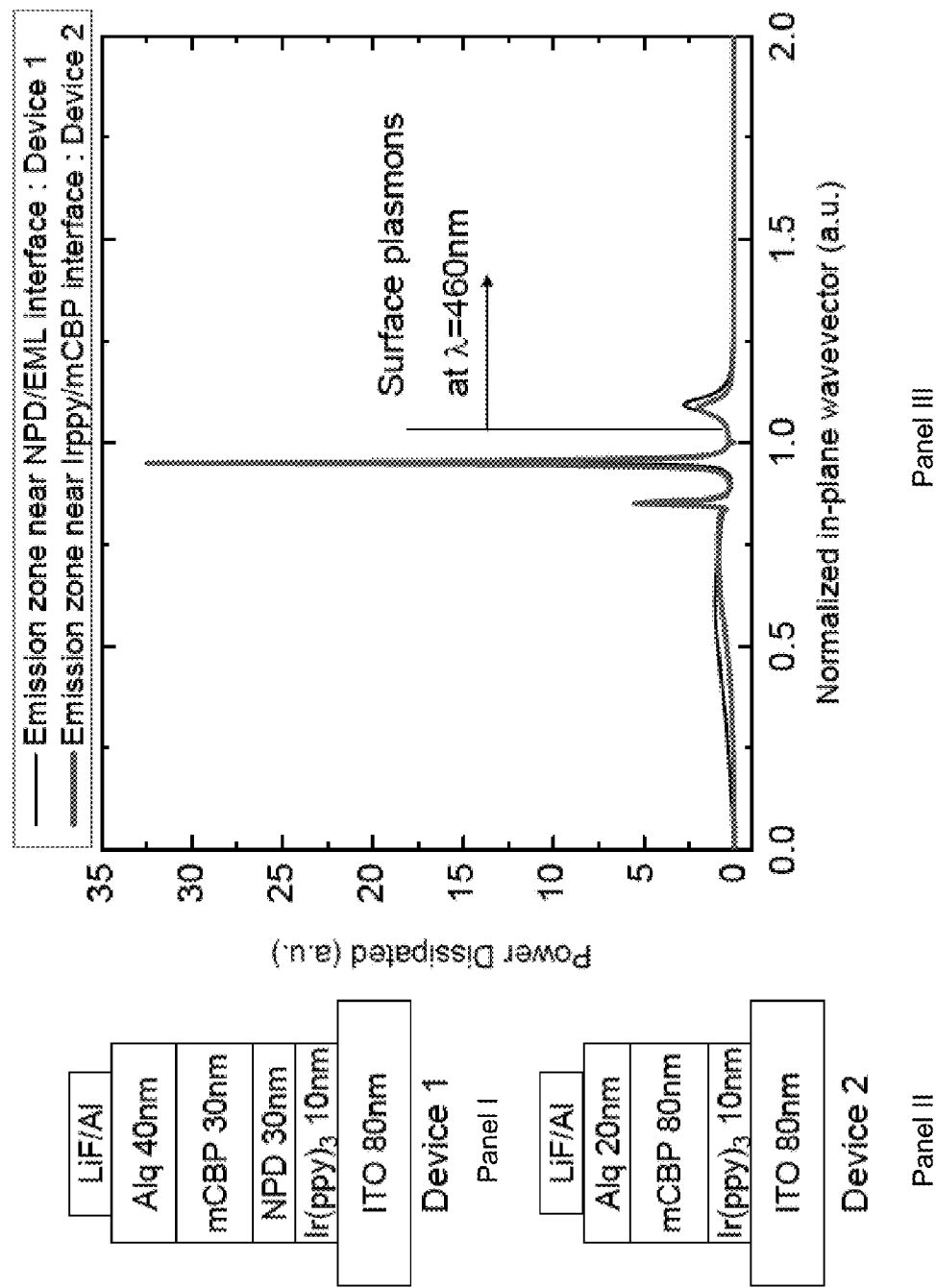
FIG. 7 shows a plot of the percentage power dissipated versus normalized in-plane wavevector for the devices in Panel I and Panel II.

If the dissipation of power (at a wavelength of about 460 nm) is modeled into surface plasmon modes for two locations within the device structure shown in FIG. 6, more power was dissipated into surface plasmon modes when the emission region (modeled as a discrete layer of dipoles) was nearer to the cathode. Likewise, Device 2 shown in FIG. 7 had lower surface plasmon power dissipation than Device 1 shown in FIG. 7. Moreover, the recombination zone should be at least about 30 nm away from the metal electrode to reduce the percentage of power in surface plasmon modes. (See Hobson ET AL., "Surface Plasmon Mediated Emission from OLEDs" ADV. MATER. 14, 1393 (2002)). A standard software package for modeling the optical modes of an OLED can be obtained from FLUXiM AG. Dorfstrasse 7, 8835 Feusisberg, Switzerland. The software may include ETFOS and SETFOS.

Figure 8:
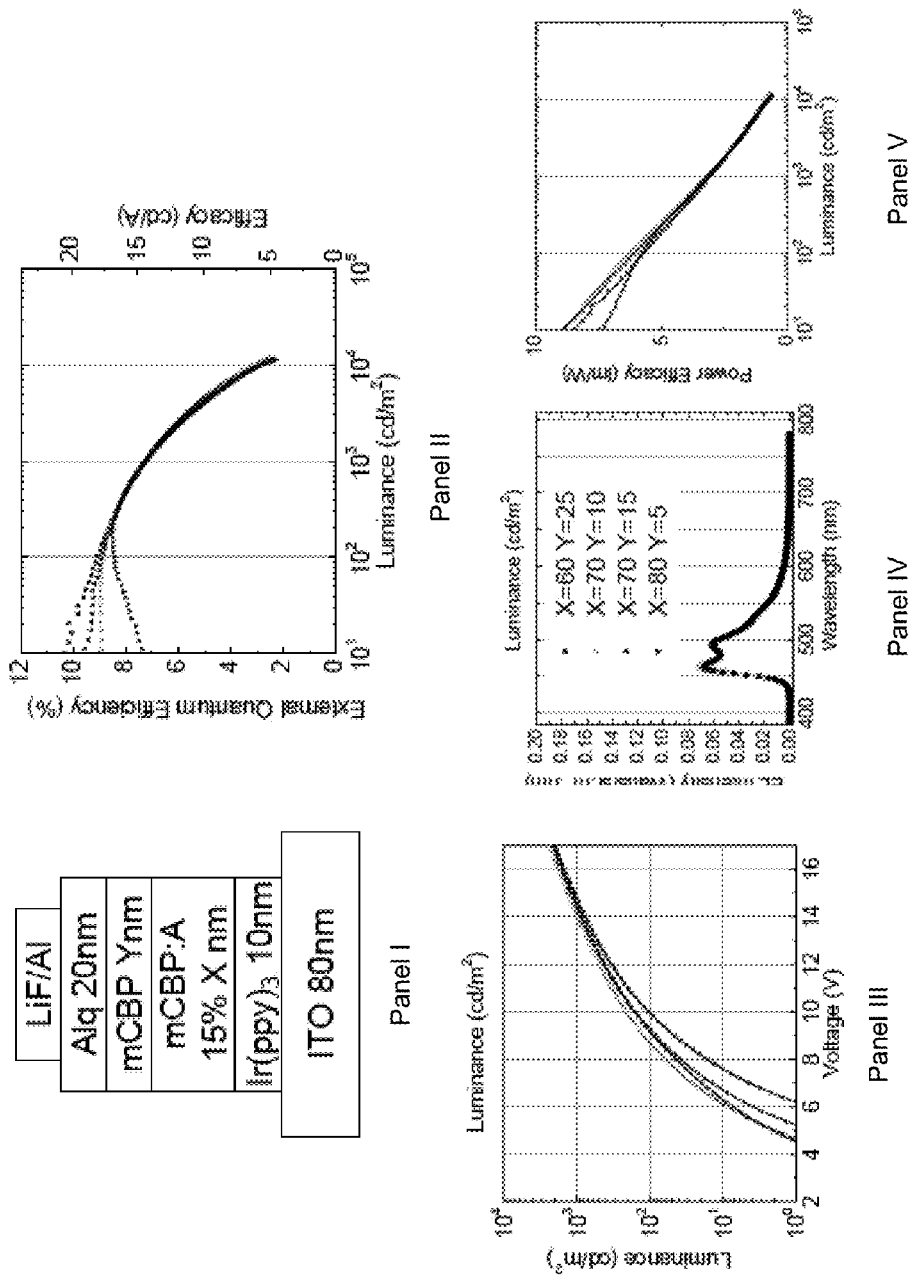
FIG. 8 shows a plot of the external quantum efficiency versus luminance, a plot of the power efficacy versus luminance, a plot of luminance versus voltage and a plot of EL intensity versus wavelength for the device in Panel II.

Additionally, the unstable nature of emitter anion states may lead to molecular decomposition of emitters carrying electrons through a device; hence, it is best that the host carries electrons before they recombine with a hole located on an emitter. One method to clearly determine that electrons are transported on the host is shown in FIG. 8. Here, the mCBP EML was divided into doped and undoped regions. Electrons may traverse the undoped mCBP layer to recombine in the doped region, and the results shown in FIG. 8 indicate that the efficiency, emission spectra were near identical in all cases. Therefore, the recombination location, electron transport mechanism and optical modes were nearly identical for all devices, and all the devices in FIG. 8 have identical lifetimes.

Moreover, the cationic state of emitters may be stable to the extent that emitters can be deposited as neat hole transport or hole injection layers and device lifetime can be several thousand hours. Therefore, blue phosphorescent emitters may be made to efficiently trap holes by decreasing the ionization potential of emitters or raising the HOMO energy closer to the vacuum level. A deep hole trap may be formed if the HOMO energy of the emitter is less than or equal to about 5.3 eV. For emitters A and B, their HOMO energies were about 4.8 eV.

Charge (electrons and holes) traverse across organic thin films in OLED devices. One standard theory that describes the conduction of charge is hopping, where a charge 'jumps' from one molecule to another in a direction determined by the potential difference between the molecules. Molecules may have a stable cationic state (to transport holes) and a stable anionic state (to transport electrons) to enable OLEDs with long operational stabilities. A stable anion or cation is one that does not decompose (break apart via bond cleavage or other irreparable transition) during the residence time of a hole or electron on the molecule as the hole or electron 'jumps' from molecule to molecule.

The residence time may vary depending on the amount of current flowing through the device, and the current may be determined by the mobility, applied potential at the electrodes and concentration of carriers. OLEDs operate over a large range of current densities in a range of about $1 \times 10^{-5}$ mA/cm$^2$ to about 10 A/cm$^2$, so charge transporting materials are expected to have stable anionic or cationic states that can support this range of current.

To test if a material has a stable anionic or cationic state, a corresponding electron-only or hole-only device may be used to determine if charge flow across the material causes changes in the properties of the hole or electron only device. An OLED has a hole and electron current, and the contribution of either current to the total current varies across the organic layers.

A device that is described as a hole-only or an electron-only has only one charge carrier across all organic layers in the device. Therefore, the cationic stability of a material may be tested if it is incorporated in a device where only holes traverse the device or the anionic stability of a material can be tested if it is material is incorporated into a device where only electrons traverse the device.

If there is any significant change over time of electrical or optical characteristics of a hole only or electron only device that is driven with a constant current, the stability of the cationic or anionic states of the constituent organic materials may be poor. If the operating voltage of a hole-only or electron-only device increases by about 0.2 V or if the PL quantum yield of the organic materials decreases by about 5%, the stability of the cationic or anionic state may be poor.

Sharp interfaces may be formed when two distinct materials are juxtaposed. The nature of the interface formed may have high concentration of charge due to energetic barriers to the transport of charge across the interface. The high concentration of charge effectively leads to enhanced molecular degradation and shorter device lifetimes.

Additionally, the method of fabricating such interfaces may allow impurities to be deposited and incorporated into devices. For example, vacuum thermal evaporation may be used to fabricate devices. Each layer may be deposited sequentially and there is typically a few minutes between the depositions of distinct layers when impurities in the vacuum system impinge of the surface of the freshly deposited material. These impurities may lead to degradation, be sites for trapped charge and alter device characteristics.

Figure 21:
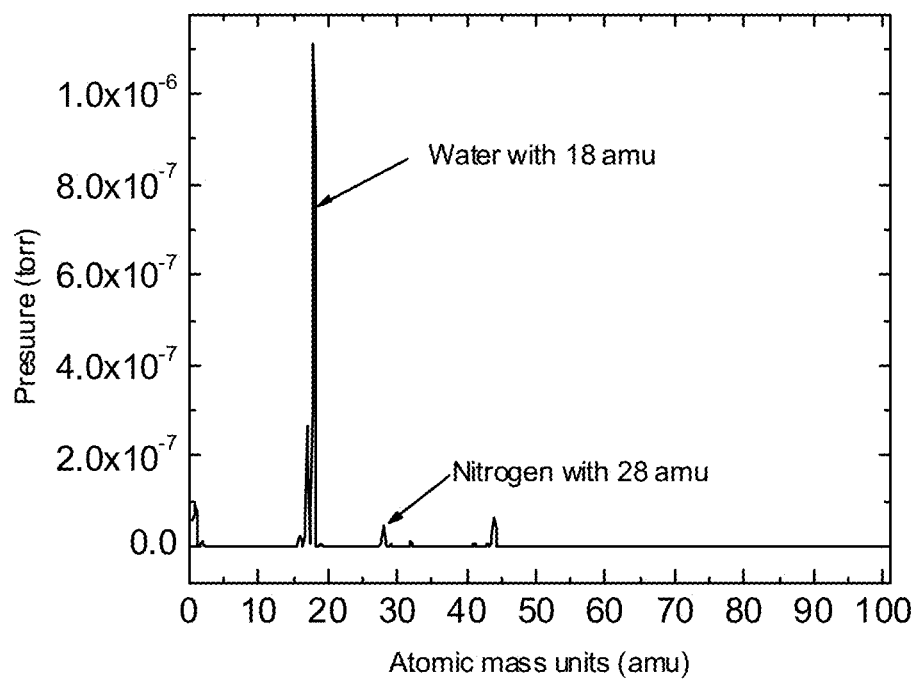
FIG. 21 shows a plot of the partial pressure of gasses in a high vacuum system versus the atomic mass unit (amu).

Ultra high vacuum systems may therefore be used to provide blue-phosphorescent OLEDs with improved operational longevity. Ultra high vacuum system have vacuum levels less than about $1 \times 10^{-8}$ Torr, preferably in the range of about $1 \times 10^{-8}$ Torr to about $1 \times 10^{-12}$ Torr more preferably in the range of about $1 \times 10^{-9}$ Torr to about $1 \times 10^{-12}$ Torr, or most preferably in the range of about $1 \times 10^{-10}$ Torr to about $1 \times 10^{-12}$ Torr. In high vacuum systems, which have higher pressure than ultra high vacuum systems, the major constituent gas is water, as shown in FIG. 21. In contrast to the high vacuum system, the ultra high vacuum system provides an environment with minimal moisture and therefore may minimize the decomposition of materials known to be photo-oxidatively unstable. First, the ultra high vacuum system may enable atomically clean interfaces between various organic materials comprising an OLED. Second, the ultra high vacuum system may prevent the co-deposition of water and other impurities with organic materials that are highly reactive and readily undergo photo-oxidation. Taken together, the ultra high vacuum system may be used to provide improved blue devices.

Blue photoemissive materials, such as Compounds A and B and other compounds of the same family, are known to be highly photo-oxidatively unstable. In the presence of moisture or oxygen and light, members of this family of materials decompose. For example, Compound A may oxidize to

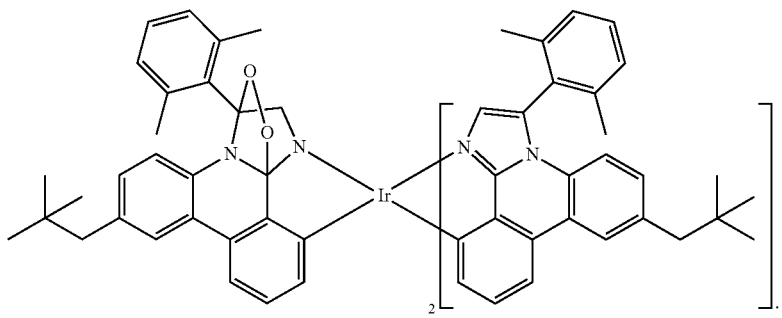

Moreover, the blue phosphorescent OLEDs containing Compounds A and B have traditionally been fabricated in high vacuum systems where moisture is readily incorporated into the organic layers and at the interfaces as explained below. Therefore, these emitters can readily photo-actively decompose, because all components required for the reaction (light plus source of oxygen) are present when the devices are turned on and emit light.

Given that the pressure of the ultra high vacuum environment may enable atomically clean surfaces and prevent deposition of impurities with reactive organic materials, the variation of various parameters with respect to pressure are considered below. In particular, these parameters include (i) gas density, (ii) mean free path of particles in the gas phase, (iii) incident molecular flux on surfaces, (iv) gas exposure, and (v) sticking coefficient and surface coverage.

Gas density. The gas density can be estimated from the ideal gas law, given by the equation:

$$n=(N/V)=P/(kT) \text{[molecules m}^{-3}\text{]},$$

where P is the pressure [N m$^{-2}$], k is Boltzmann constant and T is temperature in Kelvin.

Mean Free Path of Particles in the Gas Phase. The average distance that a particle (e.g., atom, electron, molecule) travels in the gas phase between collisions can be determined from a simple hard-sphere collision model (see, for example, Atkins' Physical Chemistry). This quantity is known as the mean free path of the particle, here denoted by λ[m], and for neutral molecules is given by the equation:

$$\lambda = \frac{kT}{1.414 P \sigma},$$

where σ is the collision cross section [m$^2$].

Incident Molecular Flux on Surfaces. The number of gas molecules impacting on the surface from the gas phase is a crucial factor in determining how long a surface can be maintained clean or, alternatively, how long it takes to build-up a certain surface concentration of adsorbed species. The incident flux, FP is defined as the number of incident molecules per unit time per unit area of surface. Of note, the flux takes no account of the angle of incidence, instead it is merely a summation of all the arriving molecules over all possible incident angles.

For a given set of conditions (e.g., P, T, etc.), the flux can be readily calculated using a combination of the ideas of (i) statistical physics, (ii) the ideal gas equation, and (iii) the Maxwell-Boltzmann gas velocity distribution. (i) The incident flux, F [molecules m$^{-2}$ s$^{-1}$], can be shown to be related to the gas density above the surface by the equation F=¼ n$\bar{c}$, where n is the molecular gas density [molecules m$^{-3}$] and c is the average molecular speed [ms$^{-1}$]. (ii) The molecular gas density can be given by the ideal gas equation, namely n=(N/V)=P/(kT) [molecules m$^{-3}$]. (iii) The mean molecular speed can be obtained from the Maxwell-Boltzmann distribution of gas velocities by integration, yielding $$\bar{c} = \sqrt{\frac{8kT}{m\pi}}.$$

Combining the equations provided above gives the Hertz-Knudsen formula for the incident flux, $$F = \frac{P}{\sqrt{2\pi mkT}}.$$

Gas Exposure. The gas exposure can be defined as a measure of the amount of gas to which a surface has been subjected. It can be numerically quantified by taking the product of the pressure of the gas above the surface and the time of exposure if the pressure is constant, or more generally by calculating the integral of pressure over the period of time of concern. Although the gas exposure may be given in the SI units of Pa s (Pascal seconds), the normal and far more convenient unit for exposure is the Langmuir, where 1 L=10$^{-6}$ Torr s, or as provided by the equation (Exposure/L)=10$^6$×(Pressure/Torr)×(Time/s).

Sticking Coefficient and Surface Coverage. The sticking coefficient, S, is defined as a measure of the fraction of incident molecules which adsorb upon the surface (i.e., a probability and lies in the range 0-1, where the limits correspond to no adsorption and complete adsorption of all incident molecules respectively. In general, S depends upon many variables, such that S=f (surface coverage, temperature, crystal face, etc.)

A monolayer (1 ML) of adsorbate corresponds to the maximum attainable surface concentration of adsorbed species bound to the substrate. The amount of time for a clean surface to become covered with a complete monolayer of adsorbate can be dependent upon the flux of gas phase molecules incident upon the surface, the actual coverage corresponding to the monolayer and the coverage-dependent sticking probability. However, a minimum estimate of the time required may be obtained by assuming a unit sticking probability (i.e., S=1) and noting that monolayer coverage is generally on the order of about 10$^{15}$ per cm$^2$ or about 10$^{19}$ per m$^2$, providing the equation Time/ML~(10$^{19}$/F) [s]. Table 1 provides a comparison of the time required to deposit a monolayer at various levels of vacuum. The time to deposit a monolayer, the gas density and the mean free path are listed for various system pressures. All values given below are approximate and are generally dependent on factors such as temperature and molecular mass.

TABLE 1

| Degree of Vacuum | Pressure (Torr) | Gas Density (molecules m$^{-3}$) | Mean Free Path (m) | Time/ML (s) |
|---|---|---|---|---|
| Atmospheric | 760 | $2 \times 10^{25}$ | $7 \times 10^{-8}$ | $10^{-9}$ |
| Low | 1 | $3 \times 10^{22}$ | $5 \times 10^{-5}$ | $10^{-6}$ |
| Medium | $10^{-3}$ | $3 \times 10^{19}$ | $5 \times 10^{-2}$ | $10^{-3}$ |
| High | $10^{-6}$ | $3 \times 10^{16}$ | 50 | 1 |
| UltraHigh | $10^{-10}$ | $3 \times 10^{12}$ | $5 \times 10^{5}$ | $10^{4}$ |

Graded interfaces may be formed by mixing two or more distinct materials in a fashion that an abrupt change from one layer to another is not formed. Graded interfaces have been shown to improve device lifetime and this device architecture may be beneficial to improving PHOLED lifetime based on the degradation model, where degradation is concentrated near an abrupt interface.

Figure 9:
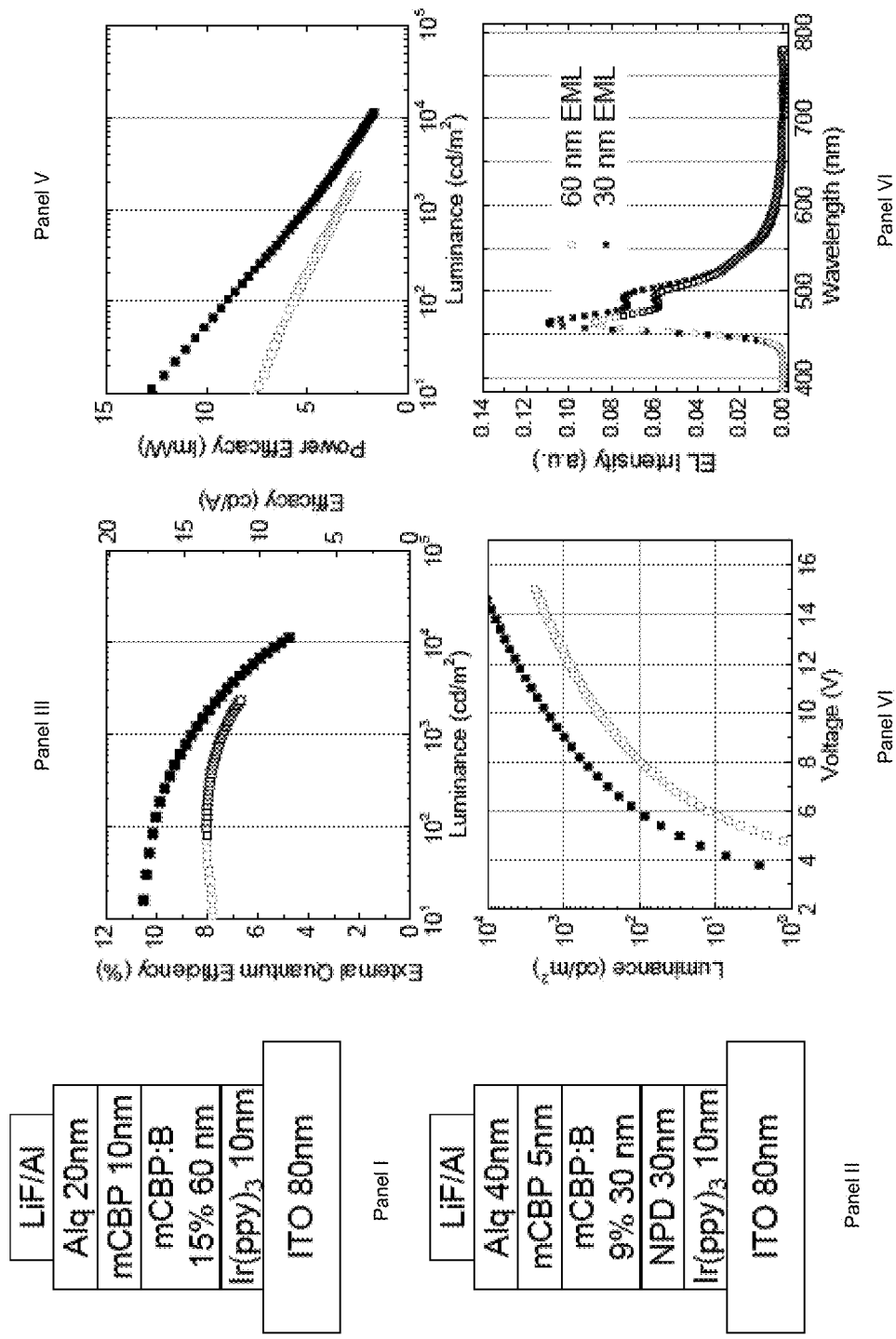
FIG. 9 shows a plot of external quantum efficiency versus luminance, a plot of power efficacy versus luminance, a plot of luminance versus voltage and a plot of EL intensity versus wavelength for the devices illustrated in Panels I and II. In the plots, the solid squares correspond to the device of Panel I, having a 60 nm EML, and the open squares correspond to the device of Panel II, having a 30 nm EML.
Figure 10:
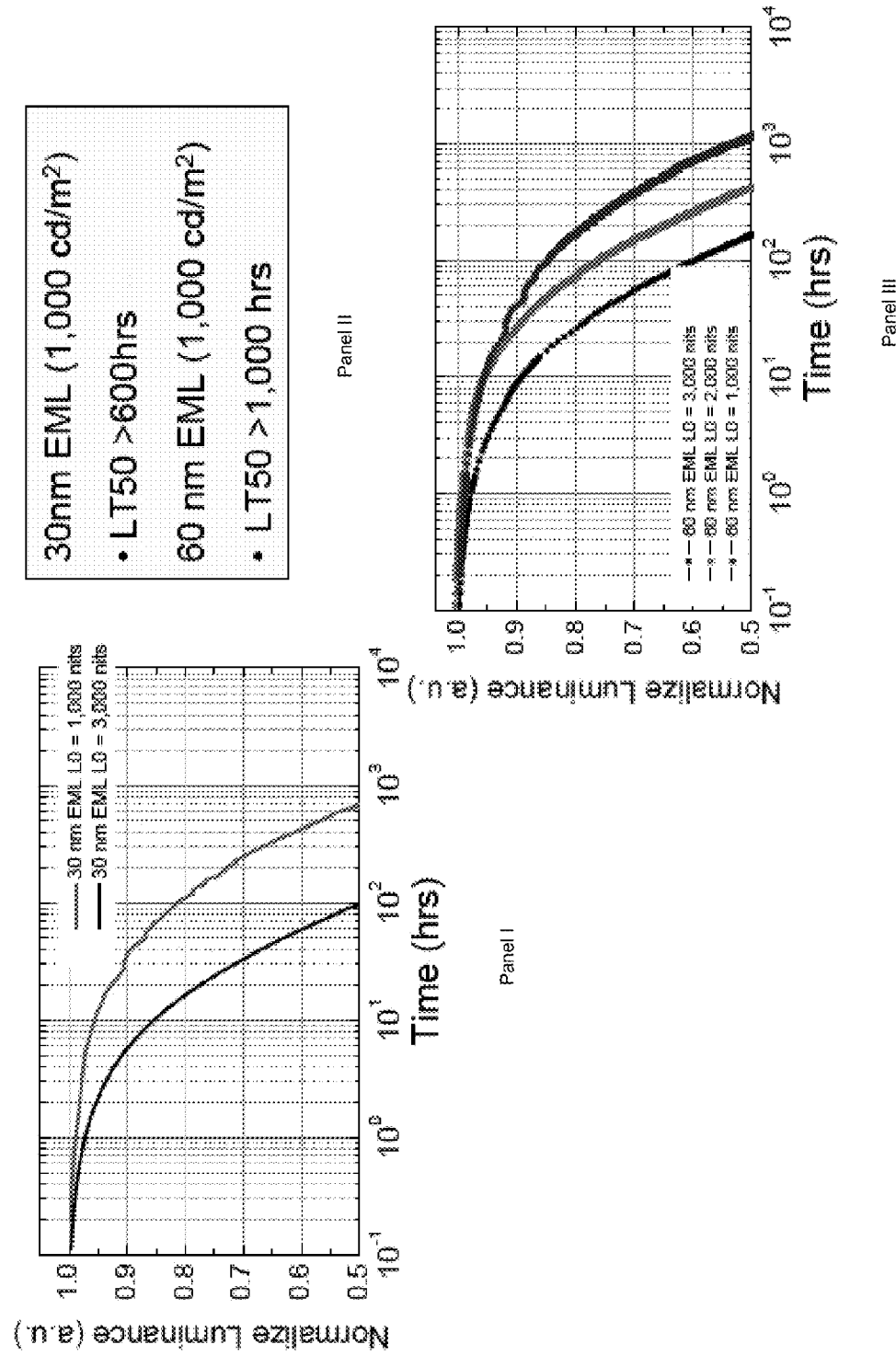
FIG. 10 shows plots of luminance versus time for the devices illustrated in FIG. 9.

FIG. 9 shows a plot of external quantum efficiency versus luminance, a plot of power efficacy versus luminance, a plot of luminance versus voltage and a plot of EL intensity versus wavelength for the devices illustrated in Panels I and II. In the plots, the solid squares correspond to the device of Panel I, having a 60 nm EML, and the open squares correspond to the device of Panel II, having a 30 nm EML. FIG. 10 shows plots of luminance versus time for the devices illustrated in FIG. 9. The device of Panel I shows higher external quantum efficiency, higher power efficacy, higher luminance, and a similar emission spectra when compared to the device of Panel II. The device of Panel I also shows a longer lifetime than the device of Panel II. The improved performance of the device of Panel I can be attributed to a combination of features: (1) a thicker EML, which may allow excitons to diffuse and therefore have a lower concentration at any given position in the EML; (2) a greater distance between the cathode and the EML (or the emissive region), which may result in reduced surface plasmon mode.

Figure 11:
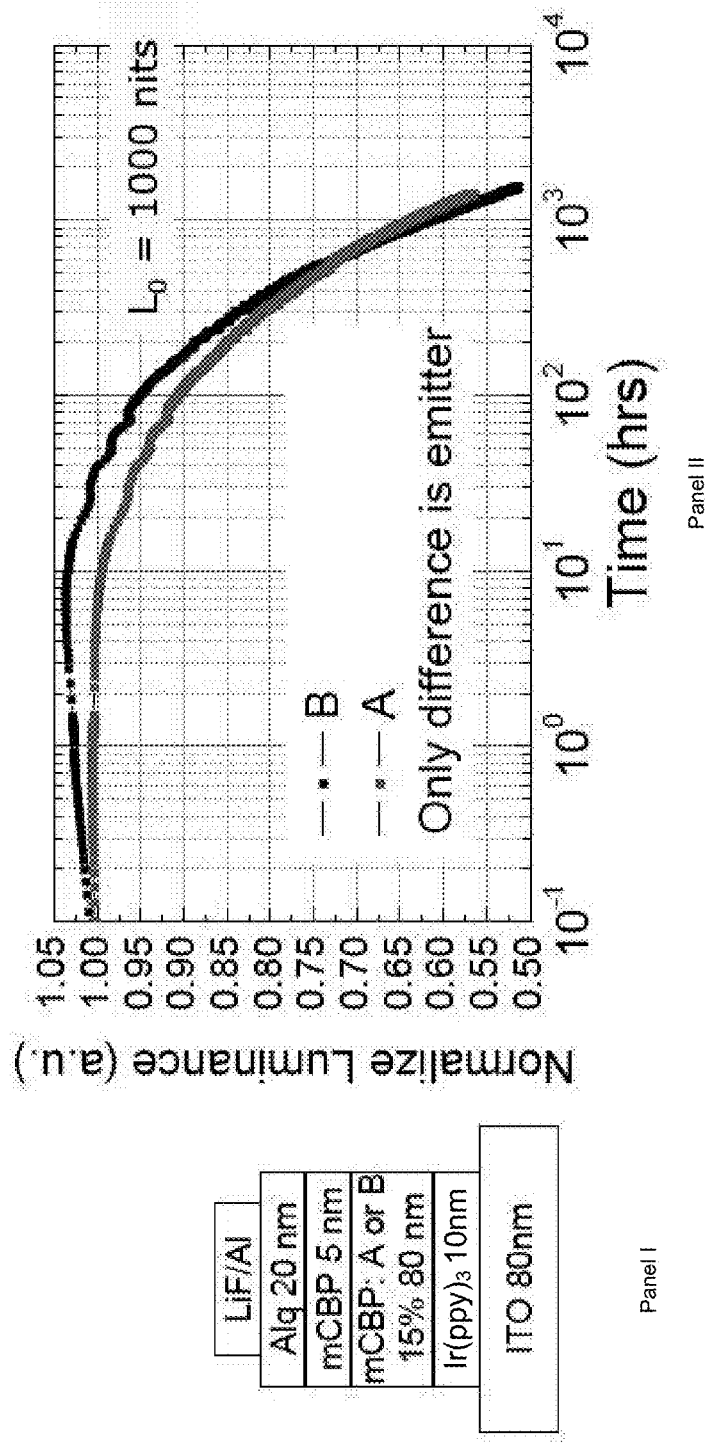
FIG. 11 shows a plot of luminance versus time for the device illustrated in Panel I.

FIG. 11 shows a plot of luminance versus time for the devices illustrated in Panel I. The only difference between the devices is that one uses dopant A (illustrated in FIG. 3) and the other uses dopant B (illustrated in FIG. 4). Dopant A is basically dopant B with a neopentyl group added. The device with dopant A shows a longer LT50 lifetime, and also has a lower rate of degradation at 50% of the initial luminance. The superior performance of the device with dopant A is attributed to the presence of the neopentyl substituent.

Another embodiment relates to minimizing the likelihood that an exciton will diffuse to encounter a polaron or a quencher by designing dopants, hosts and co-hosts that minimize the exciton diffusion length. Within a given family of dopants, this may be achieved by increasing the peripheral steric bulk of the dopant in such away that dopant to dopant energy migration is inhibited, relative to an otherwise identical dopant lacking the hindrance. One way to introduce steric hindrance may be to substitute the periphery of a cyclometallated imidazophenanthridine ligand with neopentyl substituents. In particular, neopentyl substituents may shield one face of the aromatic ring to which they are attached, and because they still possess sufficient degrees of freedom to increase the entropy of sublimation and thereby reduce the temperature and increase the cleanliness of sublimation. Therefore, incorporating neopentyl and related $R_3CCH$ and $R_3SiCH_2$ substituents, where R is hydrocarbyl or heteroatom-substituted hydrocarbyl, on the periphery of the ligands which comprise the emissive dopant in thick EML devices may be employed.

Since particular metal complexes may be photo-oxidatively sensitive, and may form green or red-emissive impurities upon undue simultaneous exposure to air and light. According to one embodiment of the invention, phosphorescent metal complexes where the presence of residual impurities arising from photo-oxidation has been minimized such that the ratio of the emission intensity at the pure emitter peak emission wavelength to the intensity at the peak wavelength plus about 80 nm is at least about 100:1 may be used.

The photoluminescence and electroluminescence of an organic material may be altered by exposure to various gases. These materials (emitters) may be doped into an organic host matrix and the photo- and electroluminescence color of the doped film may be controlled by controlling the amount of time and quantity of gas exposed to the doped film, since some dopants may change color while others may not change color. Therefore, the emission color of the film from its initial color may be precisely tuned, or to an intermediate color where some dopants have changed color, or to the color where all dopant molecules have changed color. The ability to change the color of a dopant after deposition of the material may have several unique applications for the fabrication of organic light emitting devices (OLEDs). For example, white OLEDs may be fabricated by carefully controlling the exposure of an initially blue emissive doped film to a reactive element that makes the dopant emit green or red such that some dopants continue to emit blue and some emit red and/or green to create white emission. Since the exposure to a gas can cause the emission color of the dopant to change, devices may be created that can be used as sensors for the particular gas.

For monochromatic emitters, the photo-oxidation process is highly undesirable and may be avoided by minimizing exposure to light during the synthesis of materials and fabrication of devices, and by ensuring that the material is not exposed to more than 10 ppm of oxygen. It is believed that light having a wavelength <600 nm may be responsible for much of the undesirable photo-oxidation, so avoiding exposure to such light during fabrication is desired. Avoiding exposure to any light during fabrication may also be desirable. The "near absence" of light means less than 0.1 lx as measured on an illuminance meter, such as the Minolta T-10.

Additionally, the photo-oxidation process may be avoided by minimizing exposure to moisture during the synthesis of materials and devices. It is believed that the presence of moisture may be responsible for decomposition of photo-emissive compounds, so avoiding exposure to moisture during fabrication is desired. An ultra high vacuum system provides a cleaner environment, including a reduction in the moisture present in the environment. Therefore, organic materials can be deposited in a vacuum system having vacuum levels less than about $1 \times 10^{-8}$ Torr, preferably in the range of about $1 \times 10^{-8}$ Torr to about $1 \times 10^{-12}$ Torr, more preferably in the range of about $1 \times 10^{-9}$ Torr to about $1 \times 10^{-12}$ Torr, or most preferably in the range of about $1 \times 10^{-10}$ Torr to about $1 \times 10^{-12}$ Torr. Avoiding exposure to light, exposure to oxygen and exposure to moisture during device fabrication may be used in combination with other measures to obtain high purity either individually or, preferably, in combination.

Emitters should be capable of being sublimed from a heat source under high vacuum conditions. The sublimation temperature of the emitter should be less than about 350° C. when the distance from the heated source to the OLED substrate exceeds about 50 cm and the film thickness is formed at less than about 0.3 nm/s. Decomposition of the source material during sublimation is undesirable. Decomposed source material typically forms residue, which cannot be sublimed below about 350° C. The residue may consist of fragments of the original molecule or impurities such as halides and other materials used in the synthesis of the source material.

In yet a further embodiment, devices are provided that may be fabricated by sublimation of the emissive dopant. In such cases, in order to achieve long device lifetimes, it is important that the dopant sublime cleanly. Therefore, the dopant may be designed to have sufficient stability towards sublimation as to give an HPLC assay of at least about 98% and leave a residue corresponding to less than about 5 wt % of the original charge in the sublimation crucible. Less than 5 wt % remains after the original charge is fully discharged, i.e., where there is no more appreciable deposition form the crucible when the deposition apparatus is operated under normal conditions. This criteria does not require that the crucible is fully discharged when it is used to make devices. Rather, the criteria is that the source material has sufficient stability under normal deposition conditions, that, if the crucible is fully discharged the residue is less than about 5 wt % of the original charge.

In further embodiments, structures and materials not specifically described herein may also be used, such as OLEDs comprised of polymeric materials (PLEDs) such as disclosed in U.S. Pat. No. 5,247,190, which is incorporated by reference in its entirety. By way of further example, OLEDs having a single organic layer may be used. OLEDs may be stacked, for example as described in U.S. Pat. No. 5,707,745, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091, 195, and/or a pit structure as described in U.S. Pat. No. 5,834,893, which are incorporated by reference in their entireties.

Unless otherwise specified, any of the layers of the various embodiments may be deposited by any suitable method. For the organic layers, particular methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102, which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes may be carried out in nitrogen or an inert atmosphere. For the other layers, particular methods include thermal evaporation. Specific patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods, however, may also be used.

The materials to be deposited may be modified to make them compatible with a particular deposition method. For example, substituents such as alkyl and aryl groups, branched or unbranched, and preferably containing at least about 3 carbons, may be used in small molecules to enhance their ability to undergo solution processing. Substituents having about 20 carbons or more may be used, and specifically in a range of about 3 to about 20 carbons may be used. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as a temperature in a range of about 18° C. to about 30° C., and more particularly at room temperature (about 20° C. to about 25° C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Based on the exciton-polaron model and as demonstrated by the model immediately below, it is believed that certain features and/or combinations of features result in blue devices having surprisingly long lives. The following list of features and combinations of features are exemplary and are not intended to be exhaustive.

In one aspect, charge carriers and solid state considerations are features that may result in a device having a longer lifetime. A device may have an emissive layer that includes a host having a triplet energy and a phosphorescent emissive dopant having a peak emissive wavelength less than 500 nm. The device also includes an exciton blocking layer at least 5 nm thick disposed between the emissive layer and the cathode and adjacent to the emissive layer, the exciton blocking layer consisting essentially of materials having a triplet energy greater than or equal to the triplet energy of the host of the emissive layer. The emissive layer is at least 40 nm thick. Electrons in the emissive layer are carried predominantly by the host. The HOMO of the phosphorescent emissive dopant is at least 0.5 eV higher than the HOMO of the host. The concentration of the phosphorescent emissive dopant in the emissive layer is at least 9 wt %. The phosphorescent emissive dopant comprises a cyclometallated N,C-donor imidazophenanthridine ligand comprising at least one 2,2,2-trialklethyl substituent. It is believed that this combination of features leads to a device having an unexpectedly long lifetime.

Preferably, this specific set of features described in the preceding paragraph is used in combination with an ultra high vacuum system. In particular, an ultra high vacuum system having a pressure level less than about $1 \times 10^{-8}$ Torr, preferably in the range of about $1 \times 10^{-8}$ Torr to about $1 \times 10^{-12}$ Torr, more preferably in the range of about $1 \times 10^{-9}$ Torr to about $1 \times 10^{-12}$ Torr, or most preferably in the range of about $1 \times 10^{-10}$ Torr to about $1 \times 10^{-12}$ Torr may be used in combination with the above features to improve device lifetime.

In one aspect, emitter purity is a feature that may result in devices having longer lifetime. In particular, a device that includes, inter alia, an emissive layer including a host and a phosphorescent emissive dopant having a peak emissive wavelength less than 500 nm and where (i) the phosphorescent emissive dopant is deposited from a source that has a purity in excess of about 99.5% as determined by high pressure liquid chromatography, (ii) the source further having a combined concentration of halide and metal impurities below about 100 ppm, (iii) the phosphorescent emissive dopant leaves a residue corresponding to less than about 5 wt % of the original charge in the sublimation crucible, and (iv) the phosphorescent emissive dopant has a sublimation temperature less than about 350° C. and is deposited via sublimation may have a surprisingly long lifetime.

Preferably, this specific set of features described in the preceding paragraph is used in combination with an ultra high vacuum system. In particular, an ultra high vacuum system having a pressure level less than about $1 \times 10^{-8}$ Torr, preferably in the range of about $1 \times 10^{-8}$ Torr to about $1 \times 10^{-12}$ Torr, more preferably in the range of about $1 \times 10^{-9}$ Torr to about $1 \times 10^{-12}$ Torr, or most preferably in the range of about $1 \times 10^{-10}$ Torr to about $1 \times 10^{-12}$ Torr may be used in combination with the above features to improve device lifetime.

In one aspect, charge carriers and solid state considerations are features that may result in a device having a longer lifetime. In particular, a device including an emissive layer disposed between the anode and the cathode, such that the emissive layer includes a host and a phosphorescent emissive dopant having a peak emissive wavelength less than about 500 nm and such that when a voltage is applied across the device, electrons in the emissive layer are carried predominantly by the host and where the (i) HOMO of the phosphorescent dopant is at least about 0.5 eV higher than the HOMO of the host and (ii) the phosphorescent emissive dopant has a concentration of at least about 9 wt % in the emissive layer may have a surprisingly longer lifetime.

Preferably, this specific set of features described in the preceding paragraph is used in combination with an ultra high vacuum system. In particular, an ultra high vacuum system having a pressure level less than about $1 \times 10^{-8}$ Torr, preferably in the range of about $1 \times 10^{-8}$ Torr to about $1 \times 10^{-12}$ Torr, more preferably in the range of about $1 \times 10^{-9}$ Torr to about $1 \times 10^{-12}$ Torr, or most preferably in the range of about $1 \times 10^{-10}$ Torr to about $1 \times 10^{-12}$ Torr may be used in combination with the above features to improve device lifetime.

In one aspect, structural and optical considerations are features that may result in a device having a longer lifetime. For example, a device including a CuPc hole injection layer disposed between the anode and the cathode and adjacent to the anode, an emissive layer disposed between the anode and the cathode such that the emissive layer includes a host and a phosphorescent emissive dopant having a peak emissive wavelength less than about 500 nm, and an exciton blocking at least about 5 nm thick disposed between the emissive layer and the cathode and adjacent to the emissive layer such that the exciton blocking layer consisting essentially of materials having a triplet energy greater than or equal to the host of the emissive layer and where (i) the emissive layer is at least about 40 nm thick, and (ii) the emissive layer is at least about 40 nm from the cathode may have a surprisingly longer lifetime.

Preferably, this specific set of features described in the preceding paragraph is used in combination with an ultra high vacuum system. In particular, an ultra high vacuum system having a pressure level less than about $1 \times 10^{-8}$ Torr, preferably in the range of about $1 \times 10^{-8}$ Torr to about $1 \times 10^{-12}$ Torr, more preferably in the range of about $1 \times 10^{-9}$ Torr to about $1 \times 10^{-12}$ Torr, or most preferably in the range of about $1 \times 10^{-10}$ Torr to about $1 \times 10^{-12}$ Torr may be used in combination with the above features to improve device lifetime.

In one aspect, the device may include a CuPc hole injection layer disposed between the anode and the cathode and adjacent to the anode, an emissive layer disposed between the anode and the cathode such that the emissive layer includes a host and a phosphorescent emissive dopant having a peak emissive wavelength less than about 500 nm, and an exciton blocking at least about 5 nm thick disposed between the emissive layer and the cathode and adjacent to the emissive layer such that the exciton blocking layer consisting essentially of materials having a triplet energy greater than or equal to the host of the emissive layer and where (i) the emissive layer is at least 40 nm thick; and (ii) the surface plasmon mode less than about 30% may have a longer lifetime.

In one aspect, a device is provided having an anode, a cathode, and an emissive layer disposed between the anode and the cathode. The emissive layer includes an organic phosphorescent emissive dopant, and an organic carbazole host material. The organic carbazole host material has the structure:

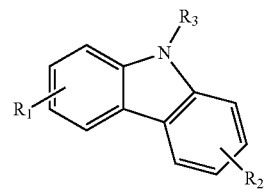

where $R_1$ and $R_2$ denote possible substitution at any available carbon atom or atoms of the indicated ring by alkyl or aryl groups, which may be further substituted. $R_3$ is an alkyl or aryl group, which may be further substituted. Preferably, the organic carbazole host material has the structure:

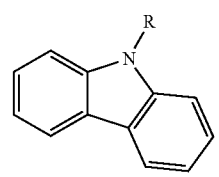

where R is an aryl group, which may be further substituted. Preferably, the carbazole host has a triplet energy corresponding to a wavelength less than 480 nm. More preferably, the carbazole host is mCBP, having the structure:

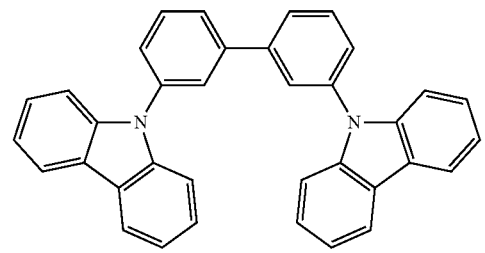 [SMILES: c1cc(-c2cccc(-n3c4ccccc4c4ccccc43)c2)cc(-n2c3ccccc3c3ccccc32)c1]

Preferably, the organic emissive dopant has a peak emissive wavelength less than 500 nm. Preferably, the organic phosphorescent emissive dopant is organometallic. More preferably, the organic phosphorescent dopant is an organometallic material having at least one organic ligand coordinated to an Ir atom. More preferably, the organic phosphorescent dopant has the structure A:

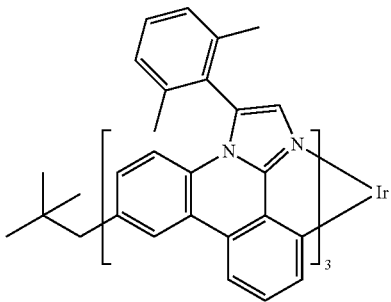

Devices with this desirable combination of host and dopant in the emissive layer may have unexpectedly long lifetimes. The devices illustrated in FIGS. 3 and 8 are examples of the combination of host and dopant described in this paragraph. Any combination of host, from general to specific, and dopant, from general to specific, described in this paragraph is desirable.

Preferably, this specific set of features described in the preceding paragraph is used in combination with an ultra high vacuum system. In particular, an ultra high vacuum system having a pressure level less than about $1\times10^{-8}$ Torr, preferably in the range of about $1\times10^{-8}$ Torr to about $1\times10^{-12}$ Torr, more preferably in the range of about $1\times10^{-9}$ Torr to about $1\times10^{-12}$ Torr, or most preferably in the range of about $1\times10^{-10}$ Torr to about $1\times10^{-12}$ Torr may be used in combination with the above features to improve device lifetime.

Experimental and Modeling

According to one embodiment, the fundamental mechanisms leading to degradation during long term operation of a typical, blue electrophosphorescent OLED are described. The trends in electrophosphorescence decay, voltage rise, and emissive layer photoluminescence quenching associated with electrical aging may be best fit to a model (infra) based on the assumption that defect sites generated during operation act as exciton quenchers, deep charge traps, and nonradiative recombination centers, Defect generation due to exciton-polaron annihilation interactions between the dopant and host molecules may lead to model predictions in good agreement with the data. Moreover, a link between guest exciton energy and the annihilation induced defect formation rate may be suggested, with increasing guest emission energy leading to increased defect formation rates. Accordingly, the model may provide that the operational lifetime of blue OLEDs may be less than green and red due to the higher energy excitations of the former system. Finally, defect densities of about $10^{18}$ cm$^{-3}$ may result in greater than about 50% degradation from initial luminance.

Figure 12:
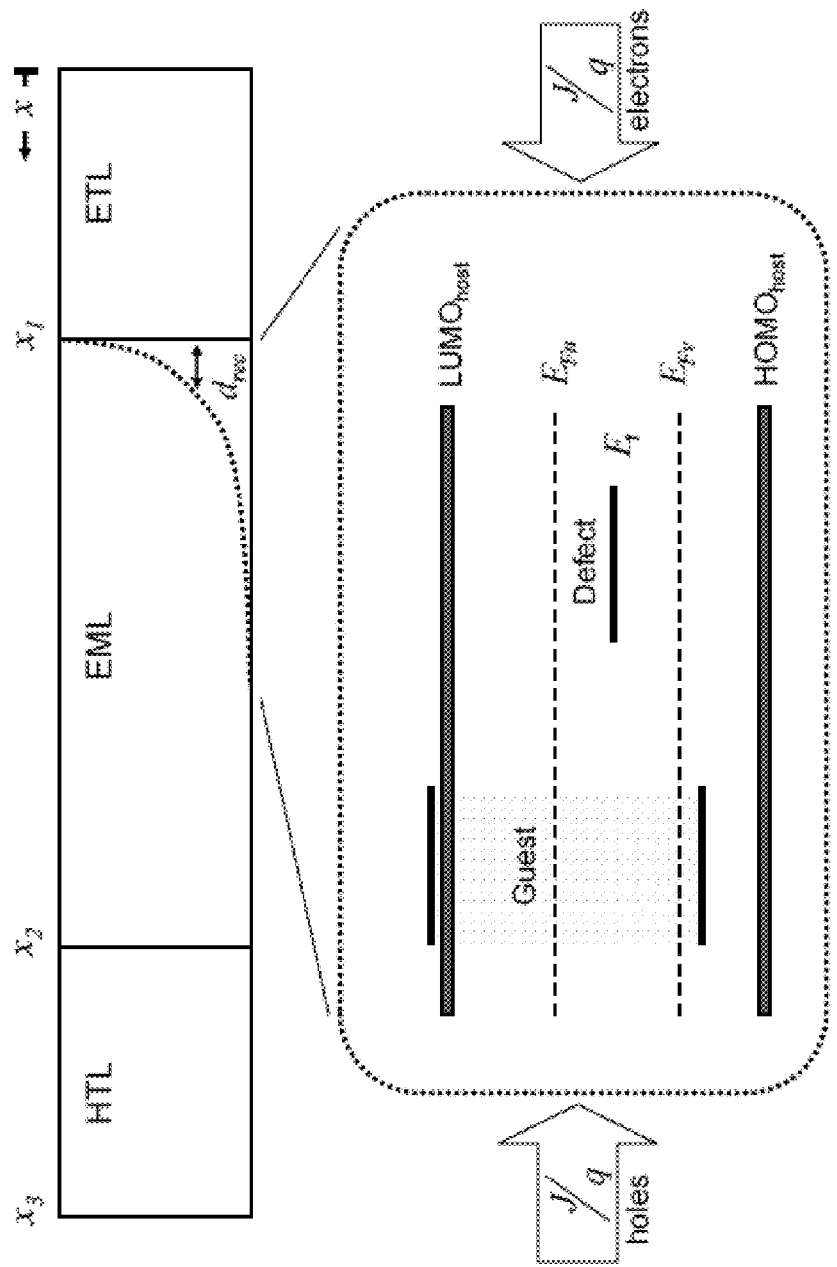
FIG. 12 provides a schematic of the model geometry and assumed energy level relationships. The recombination zone decays exponentially from the EML/ETL interface at $x_1$ with characteristic length, $d_{rec}$. Both phosphorescent guests and defects form deep traps within the host band-gap. The electron and hole quasi-Fermi levels under forward-bias are $E_{Fn}$ and $E_{Fv}$, respectively.

Depending on their energy levels, defects may act as luminescent quenchers, non-radiative recombination centers, and deep charge traps. Luminance loss may result from the first two, while voltage rise, which has been linked to the presence of fixed space charge in the emissive region, may result from filling of the deep traps. This is depicted schematically in FIG. 12 for a single, discrete, deep defect state at energy, $E_t$, that lies between the highest occupied (HOMO) and lowest unoccupied molecular orbitals (LUMO) of the host. The energetics of the phosphorescent guest are also shown in FIG. 12. Thus, both defect and guest form discrete, deep hole traps that allow for direct exciton formation, although recombination is only radiative on the guest. Luminescence quenching by defects may occur if there exists an allowed transition resonant with that of the guest or host that enables Förster or Dexter energy transfer to occur.

Defects may be assumed to act only as hole traps, with $E_t$ representing the defect HOMO. In general, however, defects may have both their HOMO and LUMO, or a singly occupied molecular orbital within the host band gap, creating both electron and hole traps. In addition, the defect state itself may not lead directly to a quenching transition, but when occupied with a trapped charge, the resulting polaron might become a quenching center. The model presented below is general, however, and although it has been derived for the specific case shown in FIG. 12, it nevertheless remains applicable to these alternative scenarios, as discussed below.

According to one embodiment, a single recombination zone that may decay exponentially from one edge of the emissive layer (EML) with characteristic length $d_{rec}$, is depicted in FIG. 12. High efficiency electrophosphorescent OLEDs may have a charge balance factor near unity, hence it is assumed that equal numbers of electrons and holes enter the recombination zone. Excitons formed on the host may then rapidly transferred and localized on the phosphorescent guests as a result of their high doping concentration and host triplet energy. As a result, exciton diffusion out of the recombination zone may be negligible.

These considerations lead to rate equations for hole (p), electron (n), and exciton (N) densities in the recombination zone as follows:

$$\frac{dp(x,t,t')}{dt} = \frac{J}{qd_{rec}(1-\exp(-(x_2-x_1)/d_{rec}))}\exp(-(x-x_1)/d_{rec}) - \gamma n(x,t,t')p(x,t,t') - \sigma v_{th}[f_D(E_t)]Q(x,t')p(x,t,t') \quad [1]$$

$$\frac{dn(x,t,t')}{dt} = \frac{J}{qd_{rec}(1-\exp(-(x_2-x_1)/d_{rec}))}\exp(-(x-x_1)/d_{rec}) - \gamma n(x,t,t')p(x,t,t') - \gamma_2[1-f_D(E_t)]Q(x,t')n(x,t,t') \quad [2]$$

$$\frac{dN(x,t,t')}{dt} = \gamma n(x,t,t')p(x,t,t') - (1/\tau - K_{DR}Q(x,t'))N(x,t,t') \quad [3]$$

The electron, hole, and exciton densities may depend on the time scale of transport and energy level transitions, t (short), as well as on that of degradation, t' (long), due to formation of defects of density Q(x,t'). The electron and hole densities may be functions of the current density, J, the elementary charge q, and the device dimensions shown in FIG. 12. Excitons may be formed at the Langevin rate, $\gamma=q(\mu_n+\mu_p)/(\epsilon\epsilon_0)$, and decay with natural lifetime, $\tau$. The hole and electron mobilities in the doped emissive layer are $\mu_p$ and $\mu_n$, respectively, the relative dielectric constant of the emissive layer is $\epsilon\approx 3$, and $\epsilon_0$ is the permittivity of free space.

In Equation (1), holes with thermal velocity, $v_{th}\sim 10^7$ cm/s, trap at defect sites of energy, $E_t$, and cross section, $\sigma$. The Fermi factor, $f_D(E_t)=[\exp(E_t-E_{Fv})+1]^{-1}$, gives the probability that the hole trap is empty, where $E_{fv}$ is the hole quasi-Fermi energy. Electrons in Equation (2) non-radiatively may recombine at a rate proportional to the trapped hole density, $Q(x,t')[1-f_D(E_t)]$, and the reduced Langevin coefficient, $\gamma_2=q(\mu_n)/(\epsilon\epsilon_0)$, since trapped holes are assumed to be immobile. Quenching of excitons by defects is described by the bimolecular rate coefficient, $K_{DR}$, in Equation (3). Note that only the constant prefactors change if defects trap electrons, or both carrier types, instead of only holes, as considered above.

The defect generation mechanism has four possible routes:

$$\frac{dQ(x,t')}{dt'} = \begin{cases} K_X n(x,t') & K_X p(x,t') & [4a] \\ K_X N(x,t') & [4b] \\ K_X N^2(x,t') & [4c] \\ K_X N(x,t')n(x,t'), & K_X N(x,t')p(x,t') & [4d] \end{cases}$$

where the rate constant, $K_X$, is consistent in dimension with the order of the reaction. In Equation (4a), the presence of an electron or hole (i.e. a polaron) leads to molecular degradation, while in Equation (4b) excitons are responsible. Defect formation is a product of exciton-exciton annihilation in Equation (4c), and of exciton-polaron (hole or electron) annihilation in Equation (4d).

On the short time scale, t, Equations (1)-(3) are at steady state and may be solved to yield an expression for N (x,t'). The resulting, coupled differential equations containing N(x,t') and Q(x, t') may then solved numerically. Thus, the normalized OLED luminescence as a function of time is:

$$El_{norm}(t') = \frac{\int_{x_1}^{x_2} N(x,t')}{\int_{x_1}^{x_2} N(x,0)},$$  [5]

and the defect formation rate per exciton, averaged over the recombination zone is:

$$F_X(t') = \frac{1}{d_{rec}} \int_{x_1}^{x_2} \frac{1}{N(x,t')} \frac{dQ(x,t')}{dt'} dx.$$  [6]

Here, the integration limits, $x_1$ and $x_2$, are defined in FIG. 12. The density of trapped charge increases with defect density following: $\rho_T(x,t')=qQ(x,t')[1-f_D(E_t)]$. Assuming that the growth of $\rho_T$ is offset by an equal density of opposing charge at the cathode, and that the free charge distributions under steady-state operation are not perturbed, then the voltage rise is given by:

$$\Delta V(t') \approx \int_0^{x_3} x \rho_T(x,t') dx.$$  [7]

The emissive layer photoluminescence (PL) transient will also be affected by defects. From Equation (3) at time, t', the PL intensity normalized to that at t=0 is:

$$PL_{norm}(t)|_{t'} = \frac{\int_{x_1}^{x_2} I_0(x)\exp[-(1/\tau + K_{DR}Q(x,t'))t]}{\int_{x_1}^{x_2} I_0(x)}.$$  [8]

Here, $I_0(x)$ is the intensity profile of the excitation pulse in the device emissive layer calculated by the transfer matrix method for the specific device structure, incident excitation angle, wavelength, and polarization considered.

EXAMPLES

Specific Example 1

Figure 13:
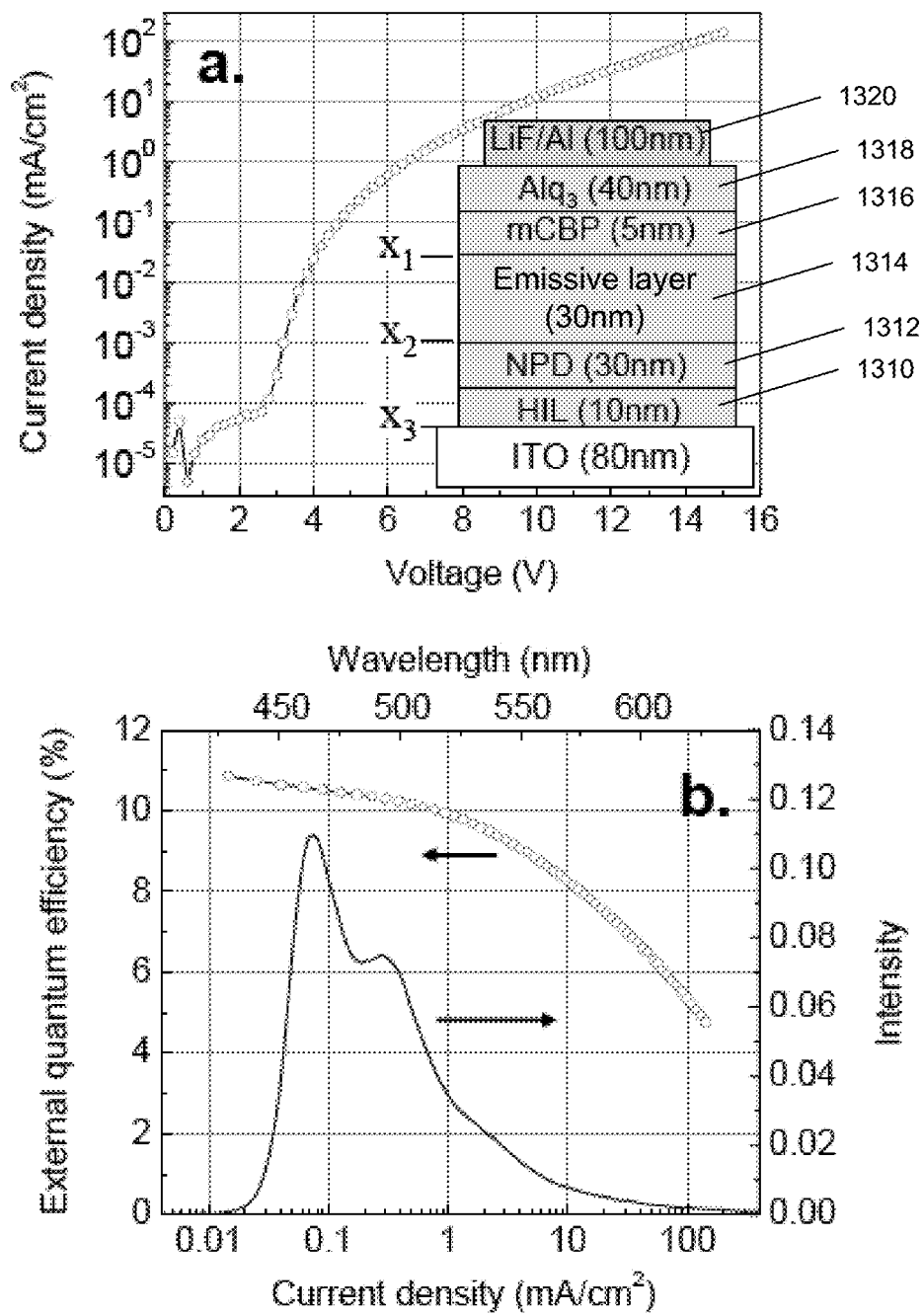
FIGS. 13A-13B.

Indium-tin-oxide (ITO) coated glass was cleaned with solvents and patterned into 2 mm$^2$ anode contact areas using standard photolithography techniques prior to organic film deposition. The ITO was oxygen plasma cleaned, exposed to UV-ozone treatment, and then loaded into a vacuum chamber with a base pressure of about $10^{-7}$ Torr. The device structure was as follows for the device of FIG. 13: a 10 nm thick hole injection layer 1310, a 30 nm thick layer of the hole transporting 4,4'-bis[N-(1-naphthyl)-N-phenyl-amino]-biphenyl (NPD) 1312, a 30 nm thick emissive layer 1314 including mCBP doped with about 9 wt % of the blue phosphor fac-tris [3-(2,6-dimethylphenyl)-7-methylimidazo[1,2-f]phenanthridine]Iridium(III), shown as molecule B in FIG. 4, and a 5 nm thick layer of mCBP 1316 for exciton confinement within the EML. Electrons were injected into the EML through about a 40 nm thick layer of tris-(8-hydroxyquinoline)aluminum 1318, capped by a cathode 1320 including of about a 0.8 nm thick layer of LiF 1322 and about a 100 nm thick Al film 1324. Following deposition, the OLEDs were transferred directly from vacuum into an oxygen and moisture-free $N_2$ glove box, and were subsequently encapsulated using a UV-curable epoxy, and a glass lid containing a moisture getter.

External quantum (EQE) and power efficiencies were calculated from the spectral intensity measured normal to the substrate using a SpectraScan PR705. The current and voltage measurements were obtained using a Keithley 236 source measurement unit. Operational lifetime measurements were performed at room temperature, and devices were aged at various constant currents while monitoring their operational voltage and light output. Photoluminescence transients were obtained periodically during electrical aging using a time-correlated single photon counting system from Horiba Jobin Yvon, with a wavelength of about $\lambda=335$ nm, pulsed excitation source incident at about 45° from normal. Photoluminescence from the emissive layer was obtained at a wavelength of about $\lambda=470$ nm to prevent collection of fluorescence from the transport layers.

The current density-voltage (J-V) characteristics and EQE for the OLEDs were plotted in FIGS. 13A and 13B, respectively. The device showed a peak forward viewing EQE= (11.0±0.2) %. The emission spectrum at J=10 mA/cm$^2$, with a peak at $\lambda=464$ nm, was due to the dopant and remained the same at all current densities, indicating that the recombination zone remained within the EML. The recombination was highest at the EML interface adjacent to the thin mCBP blocking layer 1316. This conclusion was supported by the lack of NPD emission, and the fact that removal of the mCBP blocking layer resulted in significant $Alq_3$ emission.

FIG. 14A provided the normalized electrophosphorescence versus time for four different drive current densities: about 6.9, about 15.1, about 24.3 and about 34.4 mA/cm$^2$ corresponding to initial (t'=0) luminances of $L_0$=about 1000, about 2000, about 3000, and about 4000 cd/m$^2$, respectively. The operational lifetime, $LT_{80}$, corresponded to the time required for the luminance to degrade to 0.8 $L_0$. The rate of luminance loss increased monotonically with J; here lifetimes decreased from about 110 hrs at about 6.9 mA/cm$^2$, to about 9 hrs at about 34.4 mA/cm$^2$. The solid lines in FIG. 14A were derived from the model under the assumption that exciton localization on a dopant or host molecule led to defect formation (Equation 4b). The same experimental data were reproduced in FIGS. 14B and 14C to compare the model predictions for exciton-exciton annihilation (Equation 4c) and exciton-polaron (electron) annihilation (Equation 4d) defect formation processes, respectively.

The voltage rise corresponding to the luminance loss was plotted in each of FIGS. 15A-15C for comparison with each different modeling scenario. The solid lines of FIGS. 15A-

15C were calculated using the same exciton localization, exciton-exciton, and exciton-polaron degradation models as in FIGS. 14A-14C.

FIGS. 16A-16C showed PL transients obtained from an as-grown device, a device degraded to a luminance at time t' of $L(t')=0.59\ L_o(L_0=1000\ cd/m^2)$, and one degraded to $L(t')=0.16\ L_o$ ($L_0=3000\ cd/m^2$). The predictions from each model were shown by solid lines in FIG. 16A (exciton localization), FIG. 16B (exciton-exciton annihilation), and FIG. 16C (exciton-polaron annihilation). The as-grown device exhibited a natural decay lifetime of $\tau=(1.10\pm0.08)$ μs, while the degraded device transients became increasingly nonlinear, indicative of the existence of quenching. Fluorescence from NPD overlapping the λ=470 nm detection wavelength was responsible for the sharp decrease in intensity near t=0. The transients were normalized at the onset of phosphorescence, after the fluorescence had decayed to a negligible level (i.e., at about t>0.2 μs).

Figure 17:
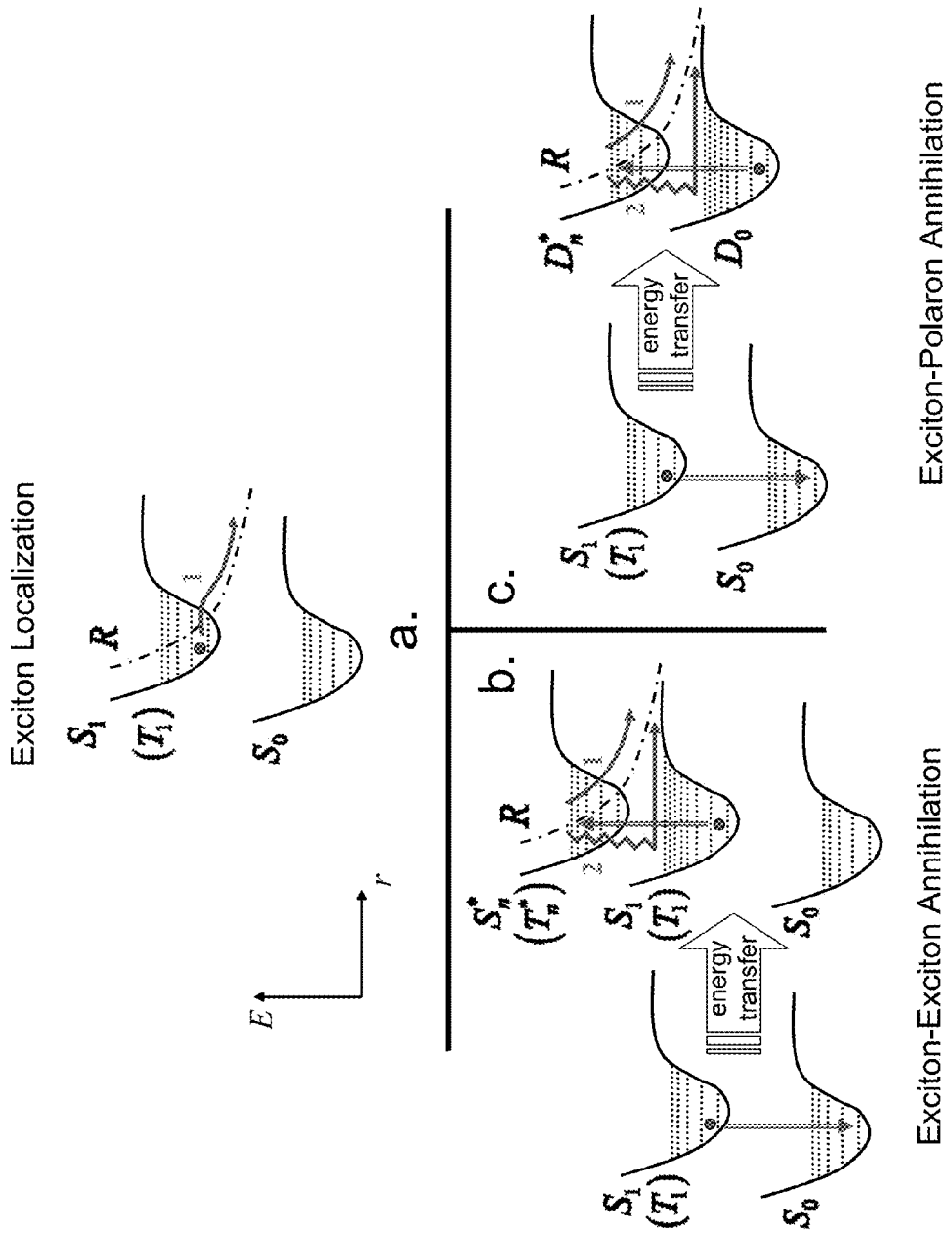
FIGS. 17A-17C are configurational diagrams showing the different dissociation mechanisms in terms of energy (E) and representative coordinate (r).

Configurational diagrams of the defect generation mechanisms proposed in Equation (4), were shown in FIG. 17. FIG. 17A shows the exciton localization pathway, where a direct or pre-dissociative potential, R, crossed the exciton energy surface. In FIG. 17B, annihilation of two singlet ($S_1$) or triplet (T) excitons yielded a ground state ($S_0$), and an upper excited state ($S_n^*$ or $T_n^*$), which were dissociated via a direct or pre-dissociative reaction (route 1) along R to yield radical fragments that resulted in defect states. Dissociation also occurred via the hot-molecule mechanism (route 2) if the upper excited state relaxed vibronically to create a hot first excited state. Similarly, FIG. 17C showed annihilation of an exciton ($S_1$ or $T_1$) and a polaron ($D_0$) to create a ground state ($S_0$) and an excited polaron ($D_n^*$), which dissociated along route 1 or 2, analogous to the previous case above.

Figure 14:
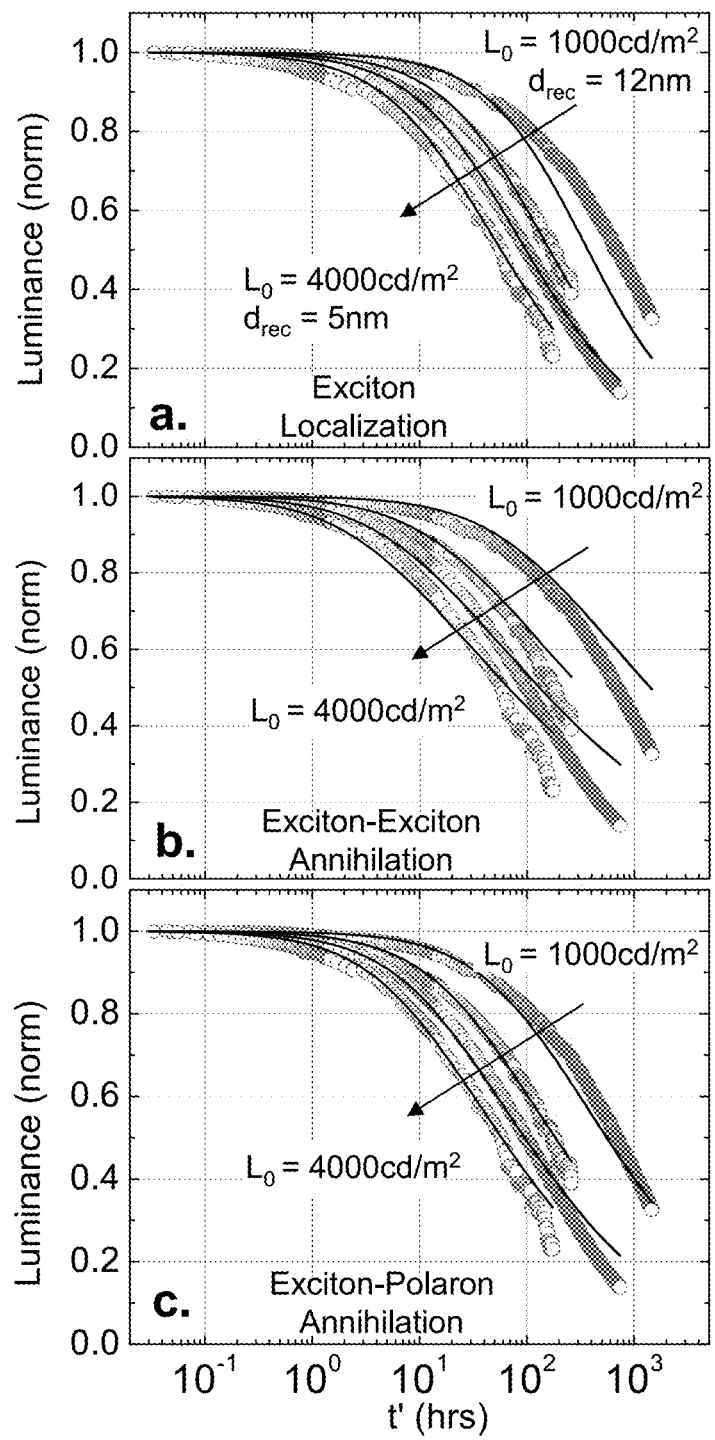
FIGS. 14A-14C.
Figure 15:
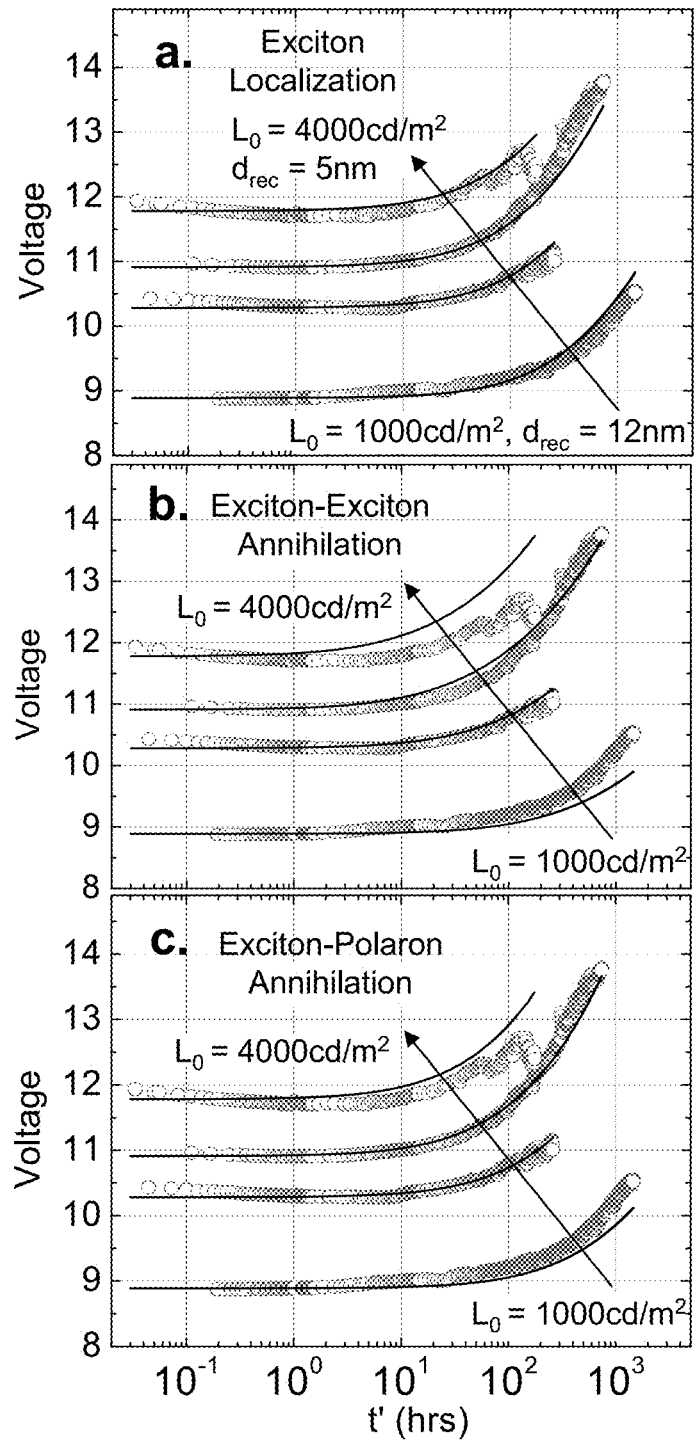
FIGS. 15A-15C.
Figure 16:
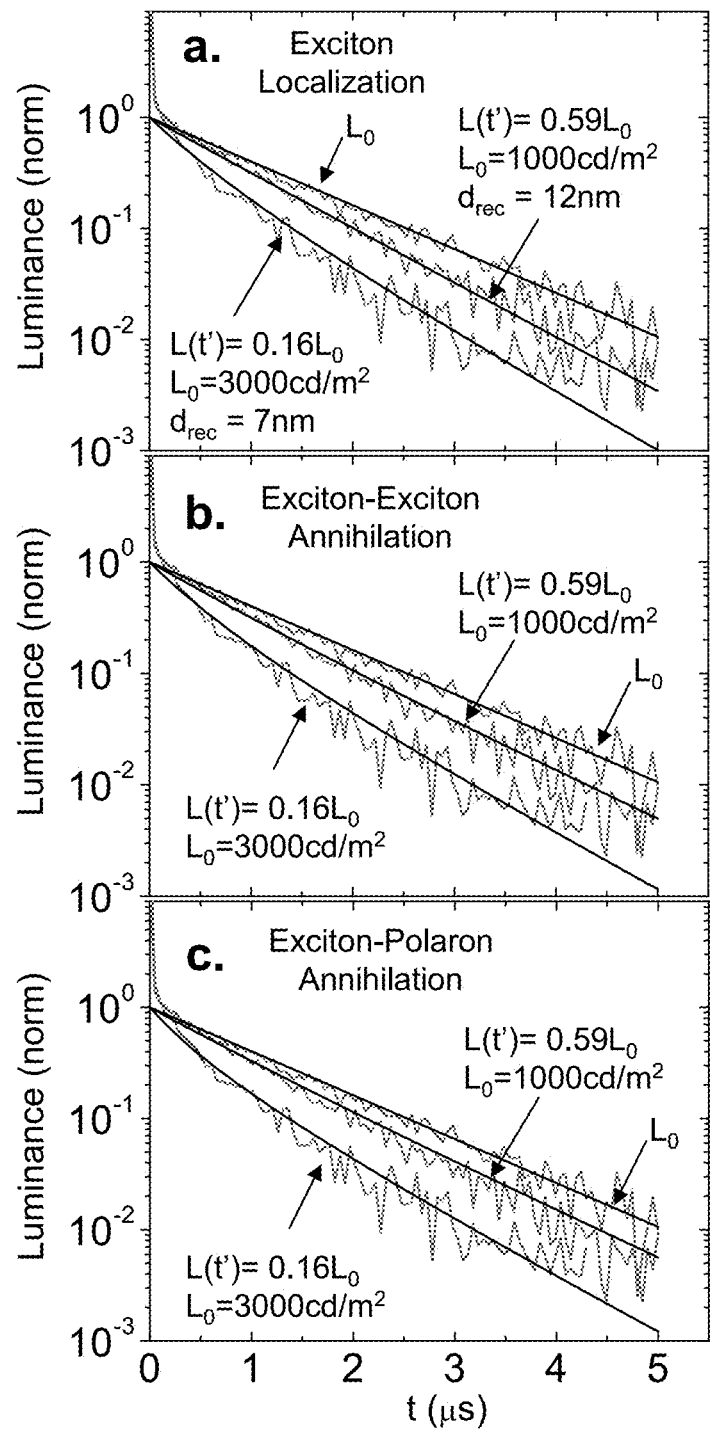
FIGS. 16A-16C.

To determine which of these processes were most active, the data in FIGS. 14-16 to the model discussed above. For each degradation model, a single set of parameters was used to fit the luminance, voltage, and PL data. The calculated luminance degradation slope following the 'knee' (i.e., onset of downward slope) of each curve (FIG. 14) depended primarily on the degradation mode assumed, while only slightly on the choice of parameter values, which determined the position of the 'knee' in time, t'. Each set of parameters is provided in Table 2, below.

$L_o$), where the data showed lower luminance than predicted. This may result from a change in charge balance due to the voltage rise FIG. 15. This resulted in higher polaron densities, and thus to an increased rate of degradation, providing a positive feedback not considered in the model.

Accordingly, each degradation mechanism was marked by its own, distinct, functional dependence. This was evident from approximate solution of Equations (1)-(3) in the limit that Q (x,t') is large ($\geq 10^{17}$ cm$^{-3}$). Use of Equation (4) yielded a polynomial of different order in Q(x,t') for each degradation mechanism: quadratic for single polaron localization (Equation (4a)), $4^{th}$ order for exciton localization (Equation (4b)), $7^{th}$ order for exciton-exciton annihilation (Equation 4(c)), and $5^{th}$ order for exciton-polaron annihilation (Equation 4(d)). The distinguishing feature of each degradation mode was thus the order of the polynomial used to fit the data, which led to the parameter-independent functional differences in the fits of FIG. 14.

The parameters in Table 1 were consistent with expectations for this guest-host materials combination. For example, the values suggested that defect hole traps are early full, lying at about 0.1 eV above the hole quasi-Fermi level. Characteristic recombination lengths were all consistent with literature reported values of in the range of about 8 nm to about 12 nm. Also, the defect exciton quenching rate, $K_{DR} \sim 4 \times 10^{-12}$ cm$^3$s$^{-1}$, was similar to that reported for other bimolecular quenching reactions in OLEDs. Low capture cross-sections of about $\sigma = 10^{-17}$ cm$^{-3}$ resulted from localization of large effective mass holes that were characteristic of organic molecules.

The relative contributions to luminance loss from defect exciton quenching and non-radiative recombination were estimated to be about 70% and about 30% respectively. The existence of quenching was confirmed by the PL data of FIG. 16, and non-radiative recombination is inferred from the presence of charged defects that led to the observed voltage rise.

The average defect density, $Q_{AVG}(t')=1/d_{rec}\int Q(x,t')dx$, was calculated using the exciton-polaron model, is shown in 18A. The increase in defect density was linear for t<10 hrs, and rolls off at longer times. From FIG. 14C and FIG. 18A, it was inferred that a defect density of about $10^{18}$ cm$^{-3}$, or about 0.1% of the molecular density leads to greater than about 50% loss in luminescence. The rates of defect formation, $F_X(t')$, corresponding to the densities in FIG. 18A, were plotted in

TABLE 2

Model Parameter Values

| | Parameter | Exciton | Ex-Ex | Ex-Pol |
|---|---|---|---|---|
| Variable | $d_{rec}$ (nm) | 12, 9, 7, 5, ±5 | 10 ± 3 | 8 ± 2 |
| | $K_{DR}$ (cm$^3$s$^{-1}$) | $(4 \pm 3) \times 10^{-12}$ | $(4 \pm 3) \times 10^{-12}$ | $(5 \pm 3) \times 10^{-12}$ |
| | $K_x$ (s$^{-1}$ or cm$^3$s$^{-1}$) | $(6 \pm 3) \times 10^{-6}$ | $(1.7 \pm 0.9) \times 10^{-22}$ | $(7 \pm 2) \times 10^{-24}$ |
| | σ (cm$^2$) | $2 \times 10^{-17}$ | $3 \times 10^{-17}$ | $10^{-17}$ |
| | $E_t - E_{Fv}$ (eV) | 0.21 ± 0.05 | 0.15 ± 0.04 | 0.17 ± 0.03 |
| Fixed, Common | J (mA/cm$^2$) | 6.85 ($L_0$ = 1000 cd/m$^2$), 15.12 ($L_0$ = 2000 cd/m$^2$) 24.26 ($L_0$ = 3000 cd/m$^2$), 34.36 ($L_0$ = 4000 cd/m$^2$) | | |
| | τ (μs) | 1.10 ± 0.08 | | |
| | $\mu_p$ (cm$^2$V$^{-1}$s$^{-1}$) | $2 \times 10^{-7}$ | | |
| | $\mu_n$ (cm$^2$V$^{-1}$s$^{-1}$) | $8 \times 10^{-8}$ | | |
| | T (K) | 295 | | |
| | $x_1$ (nm) | 40 | | |
| | $x_2$ (nm) | 70 | | |
| | $x_3$ (nm) | 115 | | |

The exciton-polaron model provided the best fit to the data, as discussed below. Electron and hole mobilities representative of those found for a similar CBP based host-guest combination were kept constant in all fits. In FIG. 14C, the model deviated slightly in advanced stages of degradation (L(t')<0.4

Figure 18:
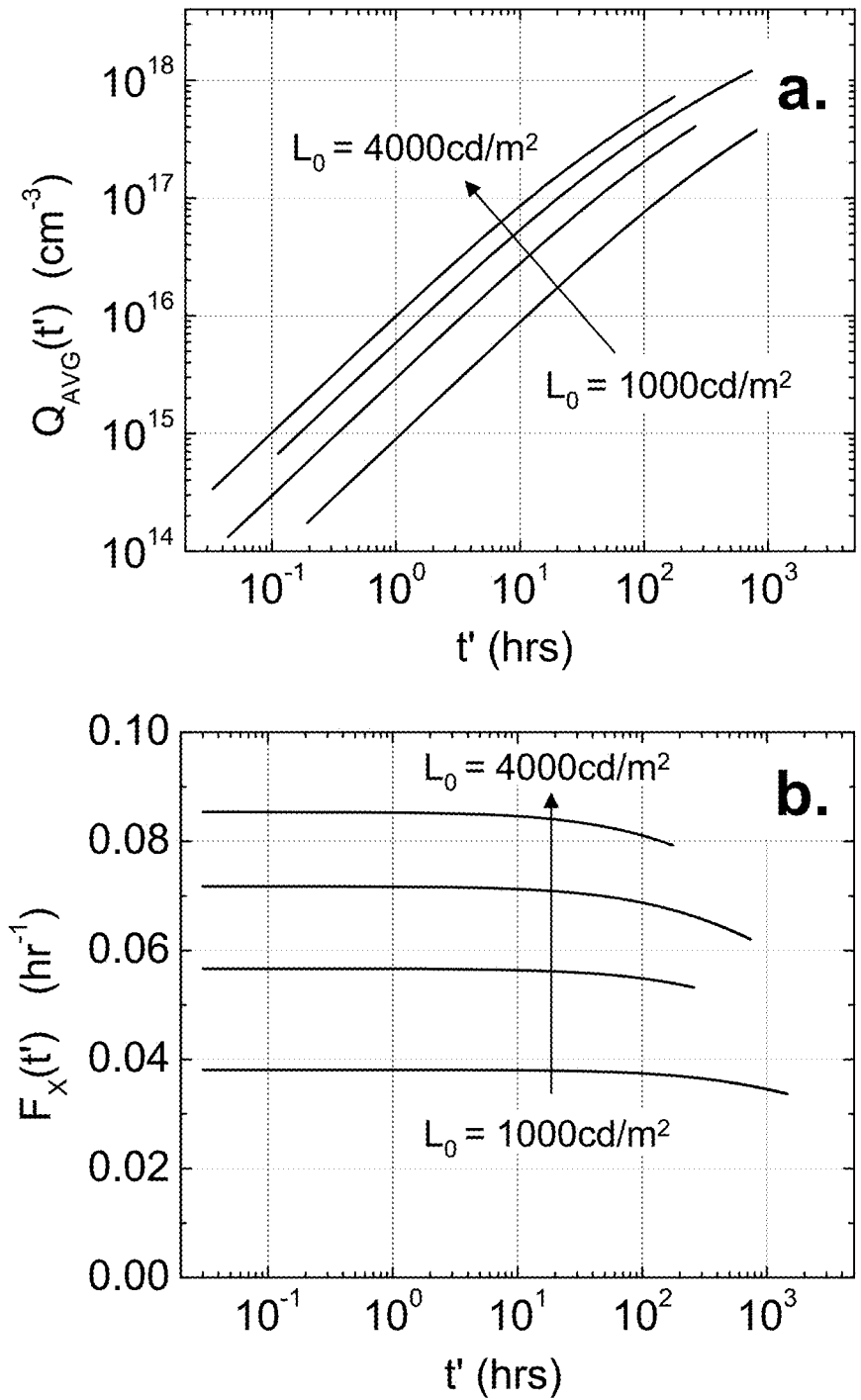
FIGS. 18A-18B.

FIG. 18B. At about 1000 cd/m$^2$, $F_X \approx 0.04$, or about 1 defect per about 25 excitons was formed every hour.

The effects of exciton-polaron annihilation on device lifetime may be reduced by increasing $d_{rec}$ and decreasing $K_X$, as shown in FIGS. 18A and 18B, respectively. These results were calculated for a device with $L_0=1000$ cd/m$^2$, maintaining all other parameters at the values in Table 1. The device lifetime more than doubled when recombination was uniform across the EML ($d_{rec} \to \infty$), as compared to $d_{rec}=8$ nm found for the devices studied here. Further, for $d_{rec}>30$ nm, there was little improvement in LT$_{80}$. Since the voltage of an OLED may be strongly dependent on layer thickness, about 30 nm may be considered a nominal upper limit to the EML thickness in practical, efficient OLEDs using some criteria. However, fabricated devices having thick EML showed remarkable lifetimes, as explained elsewhere in this application, so thicker EML may be useful in many instances. Also, in FIG. 18B, a 6-fold increase of LT$_{80}$ was calculated as $K_X$ was reduced from about $7 \times 10^{-24}$ cm$^{-3}$s$^{-1}$, to about $1 \times 10^{-24}$ cm$^{-3}$s$^{-1}$.

As indicated in FIG. 17C, it was the excess energy gained by the polaron that drove the exciton-polaron degradation mechanism. It enabled direct and pre-dissociation reactions (route 1) if the repulsive potential, R, existed. However, due to the typically fast (ps) rates of vibronic relaxation from upper excited states, the hot-molecule mechanism (route 2) was perhaps even more important. In this case, vibrational dissipation of the excess electronic energy (about 2.7 eV) led to cleavage of low energy molecular bonds.

Guest triplet excitons and host polarons were likely to be the dominant participants in the exciton-polaron defect formation reactions. The guest exciton density was much higher than the density on the host, since lifetimes on the host were short (less than about 1 ns) due to rapid energy transfer to the guests, where they exist as triplets for about 1 μs. Since both Förster and exchange exciton-polaron annihilation mechanisms were strongly distance dependent, the physical separation of guests discouraged guest-guest annihilations. Accordingly, it was inferred that energy exchanged by annihilation of the guest triplet exciton to the host polaron resulted in a dissociative process of the host molecule itself. The fragments were in close proximity to the guest molecule and thus quenched any subsequent triplets on that molecule, rendering it a permanent non-radiative center. Furthermore, as noted above, the fragmented molecule also acted as a deep trapping center, resulting in the observed operating voltage rise.

It is apparent that the efficiency of hot-molecule dissociation may increase with the amount of energy transferred to the polaron. Since this energy was provided by the guest, this suggested that the degradation rate ($K_x$) was a function of the guest exciton energy. In this case, red phosphorescent OLEDs would show the longest lifetimes, followed by green and then by blue devices. This has been observed in all OLED reliability studies to date in both polymer and small molecular weight systems, as well as for electrofluorescent and electrophosphorescent guest-host materials combinations. For example, the longest reliability observed in the red, green and blue Ir-based small molecule electrophosphorescent OLEDs were about $10^6$ hrs, $5 \times 10^4$ hrs and about $2 \times 10^4$ hrs, respectively. Although there were significant differences between the device structures and test conditions used in each of these studies, the lifetime scaling was clearly apparent and was consistent with our energy-based model for device degradation.

Figure 19:
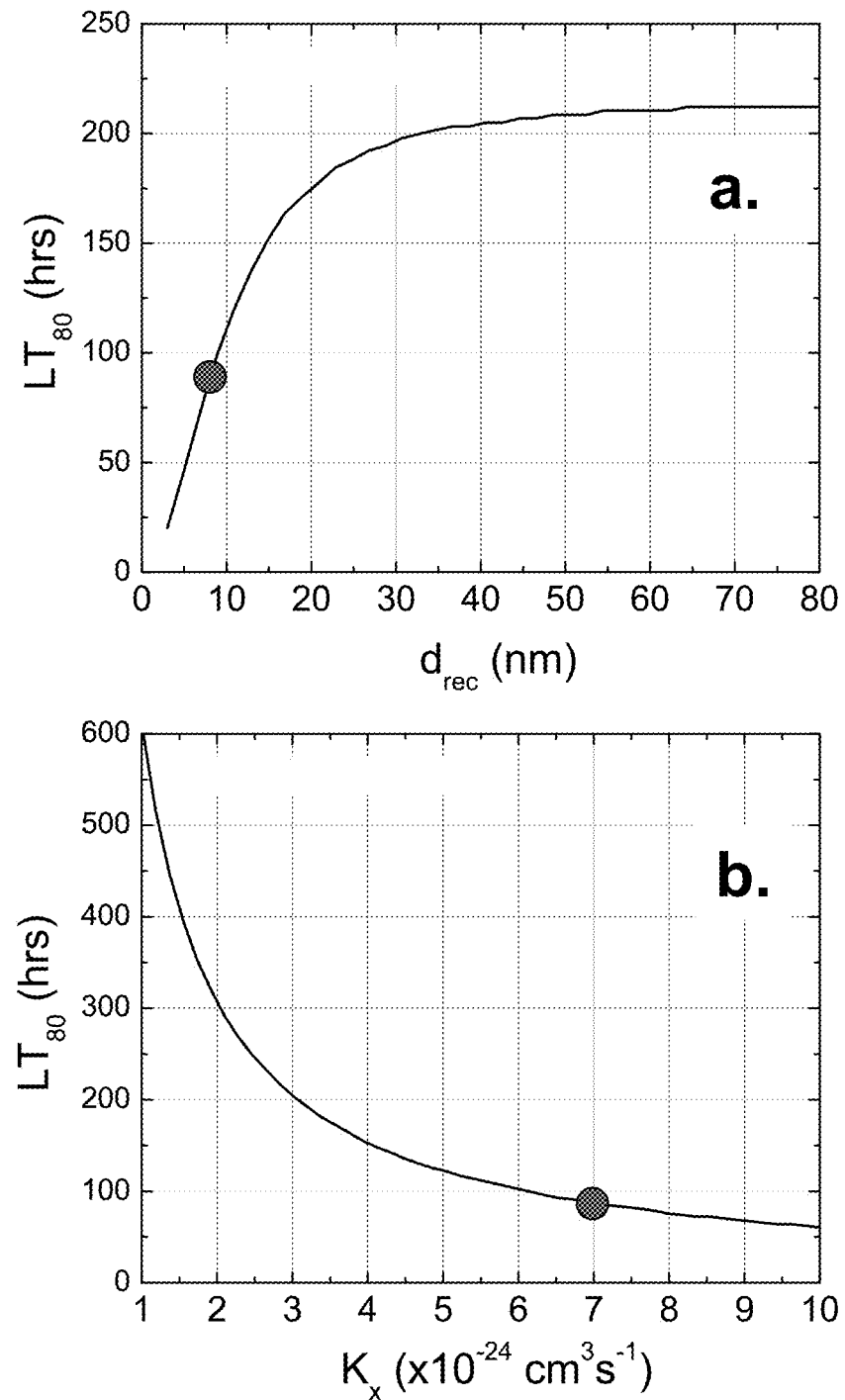
FIGS. 19A-19B.

Strategies for minimizing exciton-polaron annihilation involved lowering either $K_x$ or the densities of excitons and polarons. FIG. 19A shows the results of lowering both exciton and polaron densities by expanding the recombination zone. For example, control of electron and hole mobilities in the EML as well as the strategic placement of energy barriers in the device may lead to a more uniform and distributed recombination zone. Finally, engineering host and guest molecules to lower the annihilation probability may lead to increased lifetime (FIG. 19B) as well as improved efficiency at high brightness. Due to the distance dependence of annihilation processes, increasing the intermolecular separation through addition of steric bulk to guest and host molecules may lead to decreased $K_x$ and longer lifetimes, although this may also reduce the device efficiency by impeding exciton or charge transfer within the EML.

Specific Example 2

Figure 20:
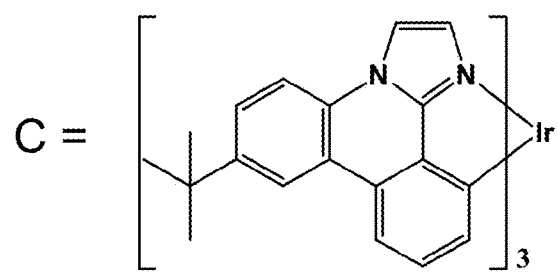
FIG. 20 shows a plot of the intensity versus wavelength for the device described in Specific Example 2.
Figure 20:
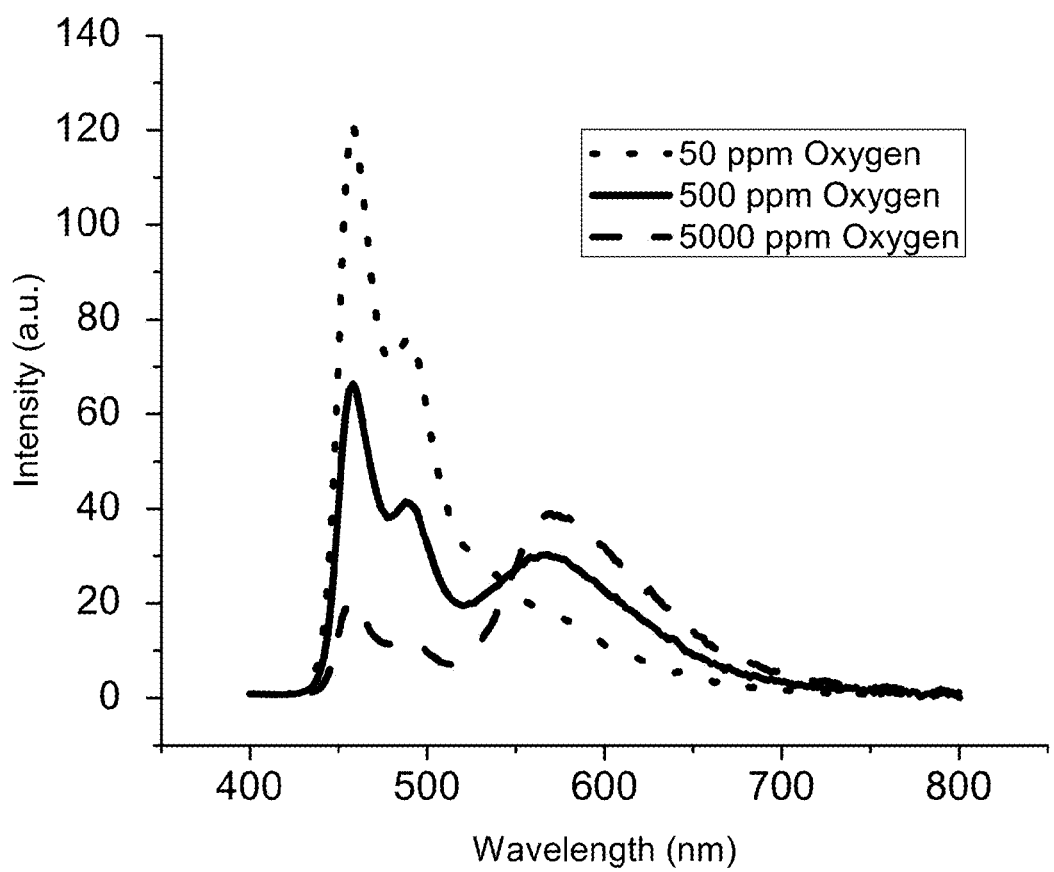

Using a conventional vacuum thermal evaporator, about a 50 nm film of mCBP containing about 6 wt. % emitter C was deposited onto a glass substrate. The film was moved directly from the vacuum evaporator into a nitrogen glove box with fluorescent white lamps. Oxygen was then bled into the glove box until it was present at 50 ppm, then the film was encapsulated using a glass lid and an epoxy seal. More oxygen was bled in to the box until 500 ppm of it was present; then, another film was encapsulated. Finally, 5000 ppm of oxygen was admitted into the box and a third film was encapsulated. By controlling the amount of oxygen in the box, the photoluminescence of the films was changed as shown in FIG. 20. More oxygen produces more red emission relative to blue emission of the deposited dopant. FIG. 20 shows the relative photoluminescence contributions of the blue emission with peaks at about 460 nm and about 490 nm and the orange emission with peak at about 570 nm were controlled by changing the amount of oxygen to which the film was exposed.

While the invention is described with respect to particular examples and specific embodiments, it is understood that the present invention is not limited to these examples and embodiments. For example, the phosphorescent materials may contain stereo and/or structural isomers. The invention as claimed therefore includes variations from the particular examples and specific embodiments described herein, as will be apparent to one of skill in the art.

Specific Example 3

A device was fabricated where each layer has been sequentially deposited using standard methods. For each example, unless otherwise described, the standard method involved purchasing substrates coated with ITO from Nippon Sheet Glass Co. Ltd of Kanagawa-ken, Japan. All layers subsequent to the ITO were deposited by vacuum thermal evaporation (VTE). The device of specific example 3 was composed of the following sequential layers: an ITO anode having a thickness of about 80 nm, a layer of LG101™ (purchased from LG, Korea) having a thickness of about 10 nm, an NPD layer having a thickness of about 30 nm, a mCBP layer including 9/12/15% dopant A, a mCBP layer having thickness of about 5 nm, a ALQ$_3$ layer having a thickness of about 30 nm, and a LiF/Al cathode (See FIG. 3, Panel I).

Specific Example 4

A device was fabricated where each layer has been sequentially deposited using standard methods. The device was composed of the following sequential layers: an ITO anode having a thickness of about 80 nm, a mCBP layer including 15% dopant B having a thickness of about 70 nm, a mCBP layer having thickness of about 10 nm, a ALQ$_3$ layer having a thickness of about 30 nm, and a LiF/Al cathode (See FIG. 4, Panel I).

Specific Example 5

A device was fabricated where each layer has been sequentially deposited using standard methods. The device was composed of the following sequential layers: an ITO anode having a thickness of about 80 nm, Ir(ppy)$_3$ layer having a thickness of about 10 nm, a mCBP layer including 15% dopant B having a thickness of about 70 nm, a mCBP layer having thickness of about 10 nm, a Alq$_3$ layer having a thickness of about 30 nm, and a LiF/Al cathode (See FIG. 5, Panel I).

Specific Example 6

A device was fabricated where each layer has been sequentially deposited using standard methods. The device was composed of the following sequential layers; an ITO anode having a thickness of about 80 nm, Ir(ppy)$_3$ layer having a thickness of about 10 nm, a NPD layer having a thickness of about 30 nm, a mCBP layer having thickness of about 30 nm, a Alq$_3$ layer having a thickness of about 40 nm, and a LiF/Al cathode (See FIG. 6, Panel I).

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting.

What is claimed is:

1. A method depositing an emissive layer for an organic light emitting device, comprising:
providing a source of a phosphorescent emissive dopant having a peak emissive wavelength less than 500 nm in a sublimation crucible having an original charge, wherein
the phosphorescent emissive dopant comprises a cyclometallated N,C-donor imidazophenanthridine ligand comprising at least one 2,2,2 trialkylethyl substituent;
the source has a purity in excess of 99.5% as determined by high pressure liquid chromatography;
the source further has a combined concentration of halide and metal impurities below 100 ppm; and
the source being sufficiently pure that a residue corresponding to less than 5 wt % of the original charge in the sublimation crucible remains after the original charge is decreased; and
depositing the phosphorescent emissive dopant via sublimation, along with a host, wherein
the phosphorescent emissive dopant is deposited in an environment having less than 10 ppm oxygen, and in the near absence of light having a wavelength less than 600 nm.

2. The method of claim 1, wherein the phosphorescent emissive dopant is deposited in an environment having less than 10 ppm oxygen, and in the near absence of light having a wavelength less than 600 nm.

3. The method of claim 1, wherein the phosphorescent emissive dopant is deposited in a vacuum system having a pressure level less than $1 \times 10^{-8}$ Torr.

4. The method of claim 1, wherein the phosphorescent emissive dopant is deposited in a vacuum system having a pressure level in the range of about $1 \times 10^{-8}$ Torr to $1 \times 10^{-12}$ Torr.

5. The method of claim 1, wherein the phosphorescent emissive dopant is deposited in a vacuum system having a pressure level in the range of about $1 \times 10^{-9}$ Torr to $1 \times 10^{-12}$ Torr.

6. The method of claim 5, wherein the phosphorescent emissive dopant is deposited in a vacuum system having a pressure level in the range of about $1 \times 10^{-8}$ Torr to about $1 \times 10^{-12}$ Torr.

7. The method of claim 1, wherein the phosphorescent emissive dopant is deposited in a vacuum system having a pressure level in the range of about $1 \times 10^{-10}$ Torr to $1 \times 10^{-12}$ Torr.

* * * * *